US010324200B2

(12) United States Patent
Shahar

(10) Patent No.: US 10,324,200 B2
(45) Date of Patent: Jun. 18, 2019

(54) SYSTEMS AND METHODS FOR IMPROVED COLLIMATION SENSITIVITY

(71) Applicant: General Electric Company, Schenectady, NY (US)

(72) Inventor: Arie Shahar, Tirat Carmel (IL)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/208,039

(22) Filed: Dec. 3, 2018

(65) Prior Publication Data

US 2019/0101657 A1 Apr. 4, 2019

Related U.S. Application Data

(63) Continuation-in-part of application No. 15/595,266, filed on May 15, 2017, now Pat. No. 10,145,964.

(51) Int. Cl.
*G01T 1/24* (2006.01)
*H01L 27/146* (2006.01)

(52) U.S. Cl.
CPC .............. *G01T 1/244* (2013.01); *G01T 1/249* (2013.01); *H01L 27/14676* (2013.01)

(58) Field of Classification Search
CPC .... G01T 1/244; G01T 1/249; H01L 27/14676
See application file for complete search history.

(56) References Cited

U.S. PATENT DOCUMENTS 4,421,986 A 12/1983 Friauf et al.
4,852,135 A 7/1989 Anisoich et al.
5,148,809 A 9/1992 Biegeleisen-Knight et al.
5,245,191 A 9/1993 Barber et al.
5,273,910 A 12/1993 Tran et al.
5,504,334 A 4/1996 Jansen et al.
5,562,095 A 10/1996 Downey et al.
5,754,690 A 5/1998 Jackson et al.
(Continued)

FOREIGN PATENT DOCUMENTS

WO 2014173812 A1 10/2014

OTHER PUBLICATIONS

Williams, M.B., et al., "Investigation of Spatial Resolution and Efficiency Using Pinholes With Small Pinhole Angle," Nuclear Science Symposium Conference Record, vol. 3, pp. 1760-1764 (Nov. 10-16, 2002).

(Continued)

*Primary Examiner* — Edwin C Gunberg
(74) *Attorney, Agent, or Firm* — Dean D. Small; The Small Patent Law Group, LLC

(57) ABSTRACT

A detector assembly is provided that includes a semiconductor detector, a pinhole collimator, and a processing unit. The semiconductor detector has a first surface and a second surface opposed to each other. The first surface includes pixelated anodes. The pinhole collimator includes an array of pinhole openings corresponding to the pixelated anodes. Each pinhole opening corresponds to a corresponding group of pixelated anodes. The processing unit is operably coupled to the semiconductor detector and configured to identify detected events from the pixelated anodes. The processing unit is configured to generate a trigger signal responsive to a given detected event in a given pixelated anode, provide the trigger signal to a readout, and, using the readout, read and sum signals arriving from the given pixelated anode and anodes surrounding the given pixelated anode.

20 Claims, 14 Drawing Sheets

(56) References Cited

U.S. PATENT DOCUMENTS

| | | |
|---|---|---|
| 5,771,308 A | 6/1998 | Florent |
| 5,825,033 A | 10/1998 | Barrett et al. |
| 5,847,398 A | 12/1998 | Shahar et al. |
| 6,002,741 A | 12/1999 | Eisen et al. |
| 6,169,287 B1 | 1/2001 | Warburton |
| 6,618,185 B2 | 9/2003 | Sandstrom |
| 7,187,790 B2 | 3/2007 | Sabol et al. |
| 7,490,085 B2 | 2/2009 | Walker et al. |
| 7,495,228 B1 | 2/2009 | Albagli et al. |
| 7,508,509 B2 | 3/2009 | Lehtikoski |
| 7,692,156 B1 | 4/2010 | Nagarkar |
| 8,013,308 B2 | 9/2011 | Guerin et al. |
| 8,143,585 B2 | 3/2012 | Guerin et al. |
| 8,405,038 B2 | 3/2013 | Bouhnik et al. |
| 9,482,764 B1 | 11/2016 | Shahar et al. |
| 2003/0099026 A1 | 5/2003 | Sandstrom |
| 2003/0128324 A1 | 7/2003 | Woods et al. |
| 2004/0195512 A1 | 10/2004 | Crosetto |
| 2005/0139777 A1 | 6/2005 | Rostaing et al. |
| 2006/0086913 A1 | 4/2006 | Spahn |
| 2006/0285751 A1 | 12/2006 | Wu et al. |
| 2007/0023669 A1 | 2/2007 | Hefetz et al. |
| 2008/0149842 A1 | 6/2008 | El-Hanany et al. |
| 2008/0237476 A1 | 10/2008 | Uribe et al. |
| 2009/0110144 A1 | 4/2009 | Takahashi et al. |
| 2011/0155918 A1 | 6/2011 | Bouhnik et al. |
| 2011/0204245 A1 | 8/2011 | Robert et al. |
| 2014/0048714 A1 | 2/2014 | Shahar et al. |
| 2014/0319364 A1 | 10/2014 | Robert et al. |
| 2015/0063671 A1 | 3/2015 | Shahar et al. |
| 2016/0245934 A1 | 8/2016 | Shahar et al. |
| 2017/0016998 A1 | 1/2017 | Shahar et al. |
| 2017/0115405 A1 | 4/2017 | Biele et al. |

OTHER PUBLICATIONS

Extended European Search Report and Opinion issued in connection with corresponding EP Application No. 18170660.7 dated Oct. 10, 2018.

Barrett, H., Eskin, J., Barber, H.; "Charge Transport in Arrays of Semiconductor Gamma-Ray Detectors", Physical Review Letters, Jul. 3, 1995, pp. 156-159, vol. 75, No. 1. The American Physical Society (4 pages).

Eskin, J., Barrett, H., Barber, H.; "Signals Induced in Semiconductor Gamma-ray Imaging Detectors", Journal of Applied Physics, Jan. 15, 1999, pp. 647-659, vol. 85, No. 2, American Institute of Physics (13 pages).

Niemela, A., Sipila, H. Ivanov, V.; "High-Resolution p-i-n CdTe and CdZnTe X-Ray Detectors with Cooling and Rise-Time Discrimination", IEEE Transactions on Nuclear Science, Jun. 1996, pp. 1476-1480, vol. 43, No. 3, (5 pages).

Warburton, W.; "An Approach to Sub-pixel Spatial Resolution in Room Temperature X-Ray Detector Arrays with Good Energy Resolution", 1988 (5 pages).

Zhu, Y.; "Digital Signal Processing Methods for Pixelated 3-D Position Sensitive Room-Temperature Semiconductor Detectors", Doctoral Dissertation, University of Michigan, 2012 (208 pages).

SYSTEMS AND METHODS FOR IMPROVED COLLIMATION SENSITIVITY

RELATED APPLICATIONS

The present application is a continuation-in-part of, and claims priority to, U.S. patent application Ser. No. 15/595,266, entitled "Systems and Methods for Improved Collimation Sensitivity," filed May 15, 2017, the entire disclosure of which is incorporated by reference herein.

BACKGROUND OF THE INVENTION

The subject matter disclosed herein relates generally to apparatus and methods for diagnostic medical imaging, such as Nuclear Medicine (NM) imaging.

In NM imaging, systems with multiple detectors or detector heads may be used to image a subject, such as to scan a region of interest. For example, the detectors may be positioned adjacent the subject to acquire NM data, which is used to generate a three-dimensional (3D) image of the subject.

Single Photon Emission Computed Tomography (SPECT) systems may have moving detector heads, such as gamma detectors positioned to focus on a region of interest. For example, a number of gamma cameras may be moved (e.g., rotated) to different angular positions for acquiring image data. The acquired image data is then used to generate the 3D images.

The size of the detector heads may limit an available usable area for the placement of detectors, such as Cadmium Zinc Telluride (CZT) wafers. The sensitivity (e.g., the proportion of radiation received relative to the radiation emitted) may be limited by the size of the detector heads and/or the arrangement of CZT wafers. Conventional approaches to improving sensitivity may use thicker detectors, or detectors arranged in generally identical or similar layers stacked directly one on top of each other. Such conventional approaches may not provide a desired or required sensitivity.

BRIEF DESCRIPTION OF THE INVENTION

In one embodiment, a detector assembly is provided that includes a semiconductor detector, a pinhole collimator, and a processing unit. The semiconductor detector has a first surface and a second surface opposed to each other. The first surface includes pixels, and the second surface includes a cathode electrode. The pinhole collimator includes an array of pinhole openings corresponding to the pixels. Each pinhole opening is associated with a single pixel of the semiconductor detector, and the area of each pinhole opening is smaller than a corresponding area of the corresponding pixel, which is exposed to radiation. (It may be noted that the pixel area less the radiation blocking area of the collimator immediately above the pixel is exposed to radiation in some embodiments). The processing unit is operably coupled to the semiconductor detector and configured to identify detected events within virtual sub-pixels distributed along a length and width of the semiconductor detector. Each pixel includes (e.g., has associated therewith) a plurality of corresponding virtual sub-pixels (as interpreted by the processing unit), wherein absorbed photons are counted as events in a corresponding virtual sub-pixel.

In another embodiment, a detector assembly is provided that includes a semiconductor detector, a collimator, and a processing unit. The semiconductor detector has a first surface and a second surface opposed to each other. The first surface includes pixels (which in turn comprise corresponding pixelated anodes), and the second surface includes a cathode electrode. The collimator includes openings. Each opening is associated with a single corresponding pixelated anode of the semiconductor detector. The processing unit is configured to identify detected events within virtual sub-pixels distributed along a length and width of the semiconductor detector. Each pixel includes (e.g., has associated therewith) a plurality of corresponding virtual sub-pixels. Absorbed photons are counted as events in a corresponding virtual sub-pixel, with absorbed photons counted as events within a thickness of the semiconductor detector at a distance corresponding to one over an absorption coefficient of the detector.

In another embodiment, a detector assembly includes a semiconductor detector, a collimator and a processing unit. The semiconductor detector has a first surface and a second surface opposed to each other. The first surface includes pixels (which in turn comprise corresponding pixelated anodes), and the second surface includes a cathode electrode. The collimator includes openings, with each opening associated with a single corresponding pixel of the semiconductor detector. The processing unit is configured to identify detected events within virtual sub-pixels distributed along a length and width of the semiconductor detector. Each pixel includes (e.g., has associated therewith) a plurality of corresponding virtual sub-pixels, with absorbed photons are counted as events in a corresponding virtual sub-pixel. Absorbed photons are counted as events within a thickness of the semiconductor detector at a distance corresponding to an energy window width used to identify the events as photon impacts.

In another embodiment, a detector assembly includes a semiconductor detector, a pinhole collimator, and a processing unit. The semiconductor detector has a first surface and a second surface opposed to each other. The first surface includes pixelated anodes, and the second surface comprising a cathode electrode. The pinhole collimator includes an array of pinhole openings corresponding to the pixelated anodes. Each pinhole opening corresponds to a corresponding group of pixelated anodes, wherein an area of each pinhole opening is smaller than a corresponding radiation receiving area of the corresponding group of pixelated anodes. The processing unit is operably coupled to the semiconductor detector and configured to identify detected events from the pixelated anodes. The processing unit is configured to generate a trigger signal responsive to a given detected event in a given pixelated anode, provide the trigger signal to a readout, and, using the readout, read and sum signals arriving from the given pixelated anode and anodes surrounding the given pixelated anode.

In another embodiment, a method includes generating, with at least one processor, a trigger signal at a given pixelated anode of a semiconductor detector responsive to an event in the given pixelated anode. The semiconductor has a first surface and second surface opposed to each other. The first surface includes pixelated anodes including the given pixelated anode, and the second surface includes a cathode electrode. Radiation is passed to the semiconductor detector via a pinhole collimator including an array of pinhole openings corresponding to the pixelated anodes. Each pinhole opening corresponds to a corresponding group of pixelated anodes, and an area of each pinhole opening is smaller than a corresponding radiation receiving area of the corresponding group of pixelated anodes. The method also includes, responsive to receiving the trigger signal, reading and summing all signals arriving from the given pixelated anode and anodes surrounding the given pixelated anode to provide a given combined event signal. Further, the method includes, determining if the given combined event signal corresponds to reception of a photon; and, if the given combined event signal corresponds to reception of a photon, counting the event in the given pixelated anode as a true event.

In another embodiment, a tangible and non-transitory computer readable medium includes one or more computer software modules configured to direct one or more processors to: generate, with at least one processor, a trigger signal at a given pixelated anode of a semiconductor detector responsive to an event in the given pixelated anode; responsive to receiving the trigger signal, read and sum all signals arriving from the given pixelated anode and anodes surrounding the given pixelated anode to provide a given combined event signal; determine if the given combined event signal corresponds to reception of a photon; and, if the given combined event signal corresponds to reception of a photon, count the event in the given pixelated anode as a true event.

DETAILED DESCRIPTION OF THE INVENTION

Figure 1:
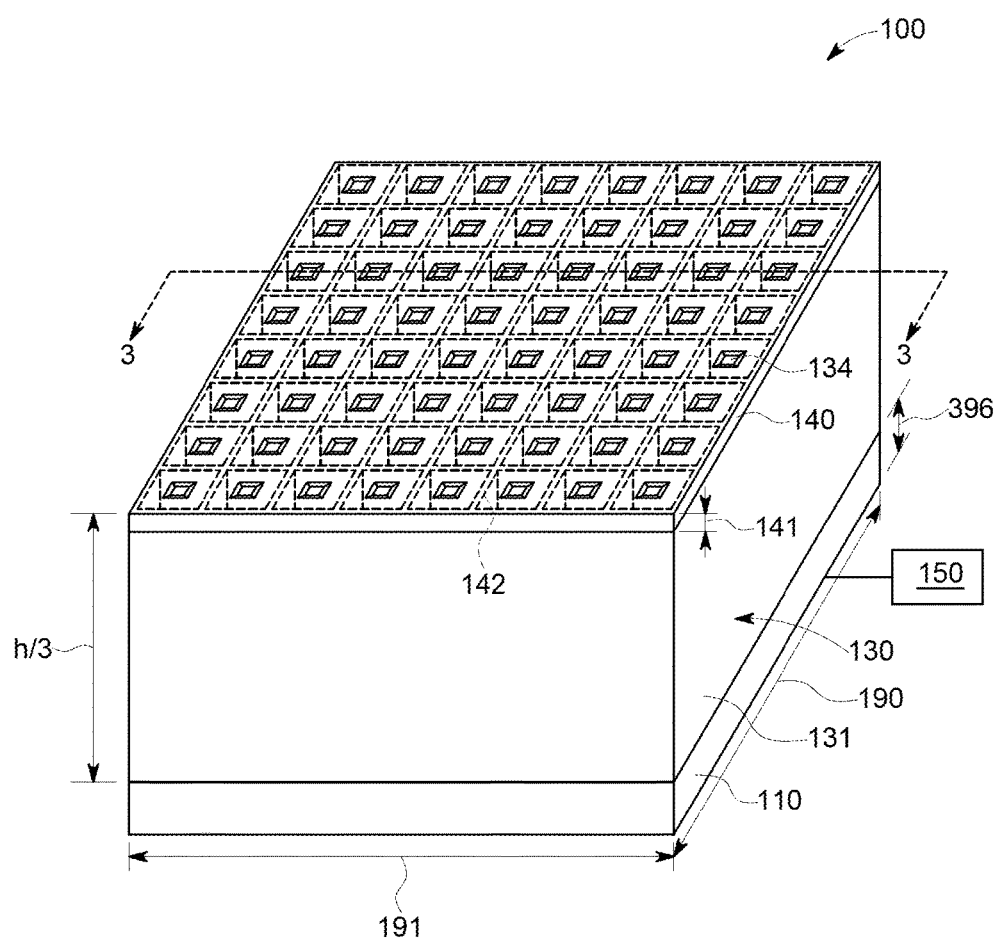
FIG. 1 provides a schematic block view of a detector assembly in accordance with various embodiments.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" of are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide systems and methods for improving the sensitivity of image acquisition, for example in Nuclear Medicine (NM) imaging applications. Various embodiments provide one or more different approaches for improving sensitivity and/or other aspects of detector performance. For example, in one approach, an array of pinhole openings are used in a collimator for a detector system. As another example, additionally or alternatively, in a second approach, all events are identified as being absorbed at a location and/or within a range corresponding to an absorption coefficient of the detector (e.g., one over the absorption coefficient of the detector). As one more example, in a third approach, all events are identified as being absorbed at a location and/or within a range that ensures that the energy of the events is measured within the energy window used for imaging. It may be noted that each of the three approaches discussed above in this paragraph may be employed with the use of virtual sub-pixels (or virtual division of the detector) along X and Y directions (or along the width and length of the detector).

In various embodiments, a pinhole collimator includes an array of pinholes that defines multiples cells. Each cell includes or corresponds to only a single physical pixel of the detector and only a single pinhole of the array. In various embodiments, in contrast to certain conventional approaches, radiation from a given pinhole (also referred to herein as a pinhole opening) only arrives at one particular physical pixel corresponding to the given pinhole. It may be noted that the physical pixel may be viewed as including a number of virtual sub-pixels by a processing unit. Each event detected in the physical pixel is counted as related to one of the virtual sub-pixels into which the physical pixel is divided to. The virtual sub-pixel to which the event belongs to is determined by the location of the event within the physical pixel that includes the virtual sub-pixels. There are known methods to derive the location of the event within the physical pixel, such as the method described in U.S. patent application Ser. No. 15/280,640 entitled "SYSTEMS AND METHODS FOR SUB-PIXEL LOCATION DETERMINATION" filed Sep. 29, 2016. The pinhole collimator provides improved image quality and spatial resolution as is explained below in reference to FIG. 8.

Further, use of a pinhole array instead of a parallel hole array in various embodiments provides for a smaller area of opening that collects radiation. For example, the size of a pinhole opening may be ⅓ of the width (or ⅑ of the area) of a pixel, whereas an opening of a parallel hole array may be the pixel size less the septa thickness. Accordingly, the opening size in a parallel hole array may be dictated by the pixel size and wall (or septa) thickness; however, in various embodiments employing a pinhole array, the opening size may be selected as desired (e.g., to provide a desired sensitivity and/or collimator height). For example, for the same sensitivity as a parallel hole collimator, an opening size for a pinhole array may be selected to provide a desired height (e.g., ⅓ of the height of a comparable parallel hole array). Additionally, in various embodiments, thicker septa may be used for a pinhole array in comparison to a parallel hole array. In some embodiments, physical pixels may be divided in multiple virtual sub-pixels (e.g., an associated processing unit may assign virtual sub-pixels to each physical pixel) along X and Y directions (or length and width of a detector), while having a single layer in the Z direction (or thickness). Alternatively, in other embodiments, multiple virtual sub-pixels may be employed along the Z direction (or thickness).

Accordingly, various embodiments provide flexibility to selected collimator height while maintaining a desired sensitivity, by adjusting the size of the openings of a pinhole array, regardless of pixel size or pitch. Such flexibility is especially advantageous when using a collimator within a swiveling detector head. For example, the collimator height may dictate or influence the radius reserved for each head for swiveling motion. The shorter the collimator is, the smaller is the required radius. Accordingly, for a shorter collimator provided by a pinhole array, more heads may be placed around the object being imaged providing improved sensitivity and image quality in comparison with a taller parallel hole collimator. Additionally, the collimator openings produce solid angles through which the virtual pixels observe the object being imaged, with the smaller size of the pinhole openings providing larger and more separated solid angles for the virtual sub-pixels, with less overlap between the solid angles for the virtual sub-pixels of a physical pixel. Accordingly, the use of such pinhole openings improves spatial resolution, or may be used to maintain a desired resolution with a shorter collimator to increase sensitivity and improve image quality. Further, still, the use of thicker septa or walls helps prevent radiation penetration from a given collimator opening to non-associated pixels (or pixels other than a pixel immediately below the opening), thereby improving image quality. Further still, it may be noted that use of many sub-voxels over the thickness of a detector may reduce the number of events for each volume of interest, thereby increasing statistical noise and degrading image quality. In various embodiments, using only one location (or range) or layer along the Z direction (or thickness) reduces statistical noise and improves image quality.

It may be noted that in some embodiments, in connection with sub-pixelization along the X and Y directions, a single Z layer, location, or range may be used to identify events along a thickness of a detector. For example, a Z position-range for all events may be defined at or around an average absorption depth of $1/\mu$, where $\mu$ is the absorption coefficient for a specific photon energy for a particular detector material. For example, events may be distributed linearly, as one example, or exponentially, as another example, within a range centered about or otherwise corresponding to distance of $1/\mu$ from the cathode. As another example, a Z position-range for all events may be defined within a range corresponding to energies of the energy window used for imaging. For example, in some embodiments, an absorption location for each absorbed photon within the thickness of the semiconductor detector is defined within a range such that $\Delta L/D = \Delta E/E$, where $\Delta L$ is a distance from the cathode, D is the detector thickness, $\Delta E$ is an energy window width, and E is a photopeak energy of an absorbed photon. Again, the events may be distributed linearly, as one example, or exponentially, as another example. In various embodiments, use of such Z position-ranges (in contrast, for example, to multiple virtual sub-pixels along a detector thickness) helps to reduce statistical noise and to improve image quality. Also, it may be noted that use of such Z position-ranges may be accomplished with simpler hardwired or software (in comparison to, for example, use of multiple virtual sub-pixels along a detector thickness), providing for easier implementation and/or lower cost.

A technical effect provided by various embodiments includes increased sensitivity of a detector system, such as a NM imaging detector system. The detector system may be provided in a rotating head detector module that may be used as part of a group of similar rotating head detector modules in an imaging system. A technical effect of various embodiments includes improved image quality and spatial resolution. A technical effect of various embodiments includes reduced collimator height allowing for less room needed to allow a detector head to pivot, allowing more detector heads to be placed closely to an object being imaged. A technical effect of various embodiments includes reduced penetration by radiation to pixels other than a pixel associated with (e.g., located directly below) a collimator opening. A technical effect of various embodiments included reduced statistical noise.

Figure 2:
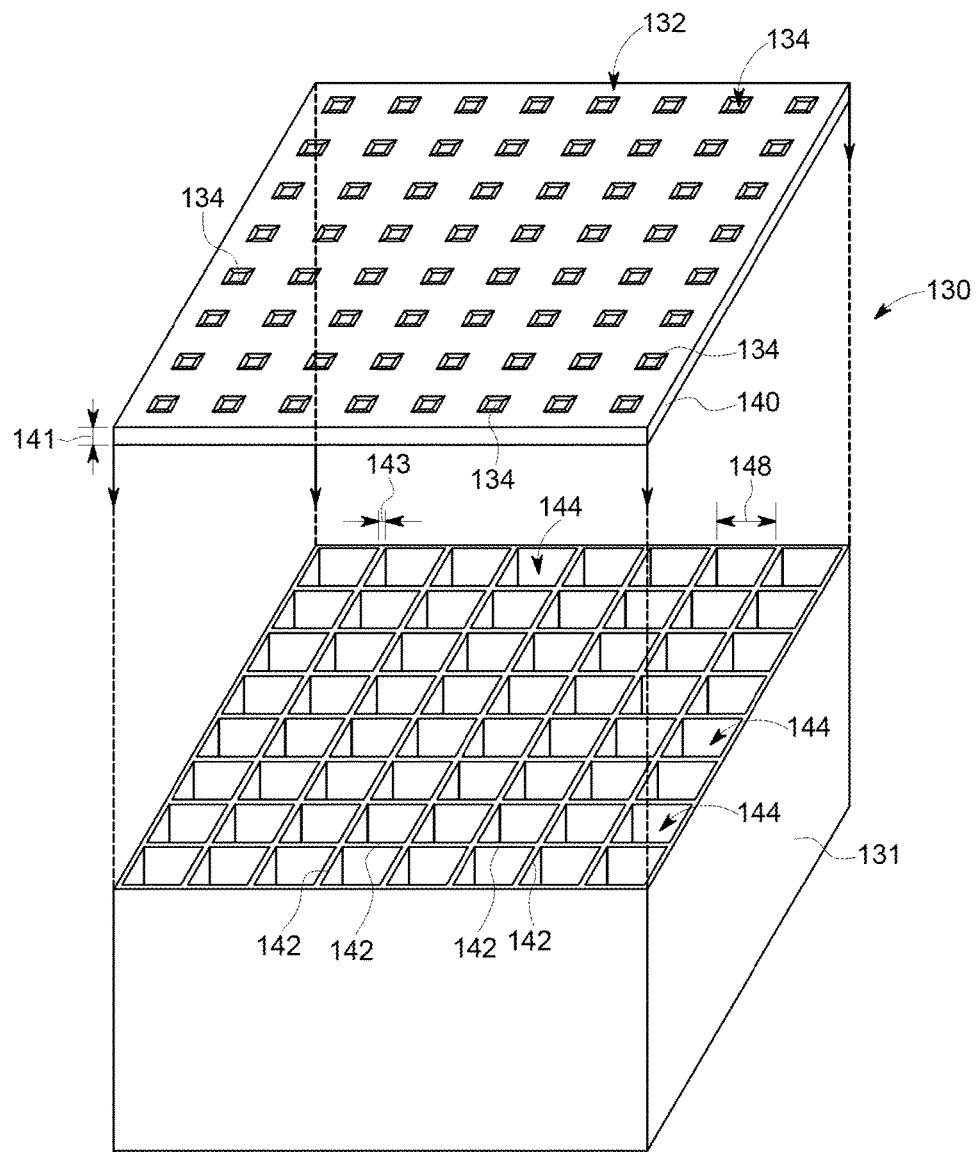
FIG. 2 provides an exploded view of aspects of the detector assembly of FIG. 1.
Figure 3:
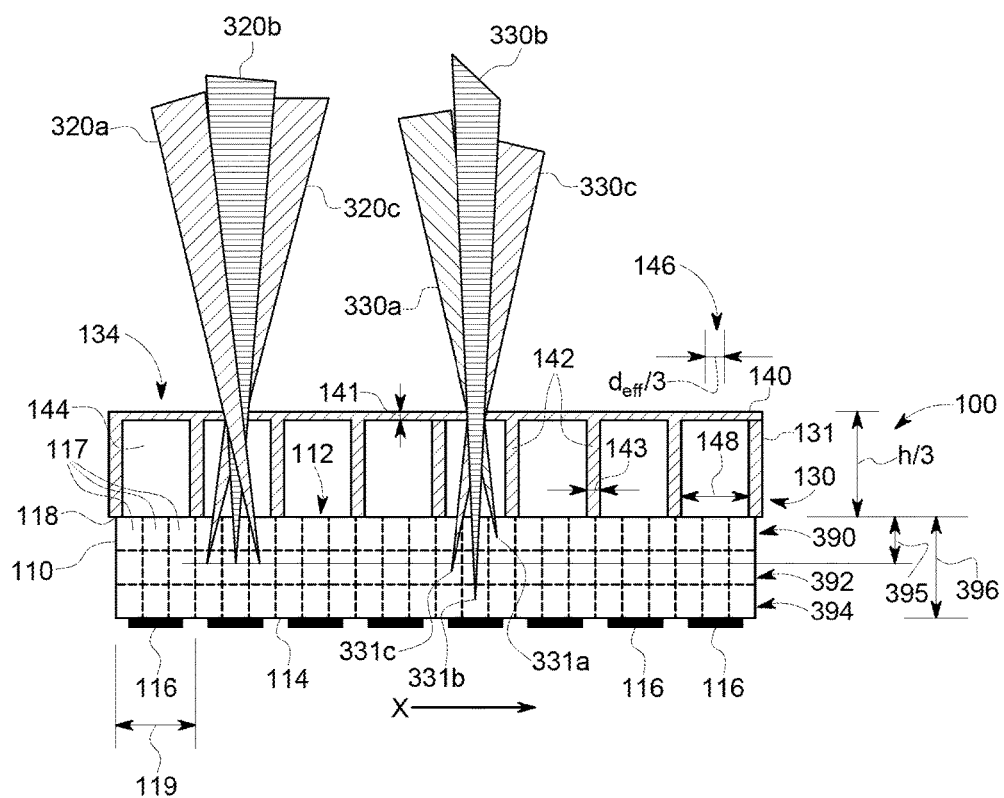
FIG. 3 provides a sectional view taken along line 3-3 of FIG. 1.

FIG. 1 provides a schematic block view of a detector assembly 100 in accordance with various embodiments, FIG. 2 provides an exploded view of aspects of the detector assembly 100, and FIG. 3 provides a sectional view taken along line 3-3 of FIG. 1. As seen in FIGS. 1-3, the detector assembly 100 includes a semiconductor detector 110, a pinhole collimator 130, and a processing unit 150, which for the clarity of the drawings is shown only in FIG. 1. Generally, the semiconductor detector 110 produces signals in response to absorption events (e.g., photons produced in response to a radiopharmaceutical that has been administered to an object being imaged that impact the semiconductor detector 110). The signals are provided to the processing unit 150, which uses identified events to reconstruct an image of the object being imaged and to derive the location of the event inside the physical pixel as described, for example in U.S. patent application Ser. No. 15/280,640. The pinhole collimator 130 guides photons to the semiconductor detector 110, and limits the angular range of approach of photons to a given pixel or portion of the semiconductor detector 110, helping to allow for accurate determination of the portion of the object being imaged from which a given detected event originated.

As best seen in FIG. 3, the semiconductor detector 110 has a first surface 112 and a second surface 114. The second surface 114 is opposed to the first surface 112 (and, likewise, the first surface 112 is opposed to the second surface 114). The semiconductor detector 110 is configured to generate electrical signal in response to photon impacts, and may be made of, for example, Cadmium Zinc Telluride (CZT). The second surface 114 includes pixelated anodes 116 disposed thereon, and the first surface 112 includes a cathode electrode 118 disposed thereon. In some embodiments, the cathode electrode 118 may be a monolithic, or single, cathode. The cathode electrode 118 collects an opposite electrical charge of the pixelated anodes 116, and the pixelated anodes 116 are used to generate signals in response to charges generated by the semiconductor detector 110 responsive to photon impacts. The pixelated anodes 116 may be arranged in a grid, with the location of one or more pixelated anodes 116 at which a signal is generated responsive to a photon impact used to determine a corresponding location in the object corresponding to the photon impact.

As seen in FIGS. 1-3, the pinhole collimator 130 is interposed between the semiconductor detector 110 and an object being imaged (not shown), and is used to control passage of radiation from the object being imaged to the semiconductor detector 110 via the pinhole collimator 130. For example, the pinhole collimator 130 guides photons to the semiconductor detector 110, limiting an angular range of approach for photons that impact the semiconductor detector 110. The pinhole collimator 130 includes an array 132 of pinhole openings 134 corresponding to the pixelated anodes 116 on the second surface 114. In the illustrated embodiment, the array 132 of pinhole openings 134 has a 1:1 correspondence with an array or grid of pixelated anodes 116, with both the pixelated anodes 116 and array 132 of pinhole openings 134 arranged in an 8×8 layout when the projections of openings 132 on the second surface 114 of the detector 110 are centered in the pixelated anodes 116. Accordingly, in the illustrated embodiment, each pinhole opening 134 is associated with a single pixelated anode 116 of the semiconductor detector 110. Accordingly, radiation that passes through a given pinhole opening 134 is confined within a single cell of collimator 130 and is absorbed at a location corresponding to one and only one pixelated anode 116 that is associated with the given pinhole opening 134 (e.g., located directly beneath the pinhole opening 134). Further, each pinhole opening 134 defines an area, with the area of each pinhole opening 134 smaller than a corresponding area of the corresponding pixelated anode 116. For example, as seen in FIG. 3, the width of each pixelated anode 116 is greater than the width of a corresponding pinhole opening 134. Accordingly, if the pixelated anode 116 and pinhole opening 134 are generally square-shaped, the area of the pixelated anode 116 is greater than the area of the pinhole opening 134. It may be noted that the depicted examples have generally square-shaped cross-sections. Other shapes of opening (e.g., circular, rectangular, or triangular, among others), may be utilized in alternate embodiments.

As best seen in FIGS. 1 and 3, in various embodiments the pinhole collimator 130 includes a top plate 140 through which the pinhole openings 134 pass. The top plate 140 is mounted to a collimator base 131. The pinhole collimator 130 also includes plural septa 142 (or walls) extending along a height of the collimator base 131 that define collimator cells 144 corresponding to the pinhole openings 134. In the illustrated embodiment, each pinhole opening 134 is associated with a particular collimator cell 144 and a particular pixelated anode 116, with photons that pass through the pinhole opening 134 passing through the corresponding collimator cell 144 toward the corresponding pixelated anode 116. Each collimator cell 144 defines a cavity between the corresponding pinhole opening 134 and the corresponding pixelated anode 116. The septa 142 act to reduce or eliminate passage of a photon through a pinhole opening 134 to non-corresponding pixelated anodes (e.g., pixelated anodes adjacent to the particular pixelated anode that corresponds to the particular pinhole opening). A cell width 148 defined by the septa 142 (e.g., a width between neighboring septa 142) is greater than an opening width 146 defined by the pinhole openings 134. For example, in some embodiments, the cell width 148 is 3 times or more greater than the opening width 146. In the example illustrated in FIGS. 1 to 3, the cell width 148 is d, and the opening width 146 is d/3, or the cell width 148 is 3 times greater than the opening width 146. It may be noted that, in contrast, an opening width and width between neighboring walls may be identical for a parallel-hole collimator.

In the example illustrated in FIGS. 1 to 3, the septa 142 are parallel to each other and define square-shaped cross sections for each collimator cell 144; however, it may be noted that different configurations may be employed in alternate embodiments. As best seen in FIGS. 2 and 3, the top plate 140 has a thickness 141, and the septa 142 have a thickness 143. In the depicted example, the thickness 141 of the top plate 140 is greater than the thickness 143 of the septa 142. In the example illustrated in FIGS. 1 to 3, the septa 142 are parallel to each other and define square-shaped cross sections for each collimator cell 144; however, it may be noted that different configurations may be employed in alternate embodiments.

Figure 4:
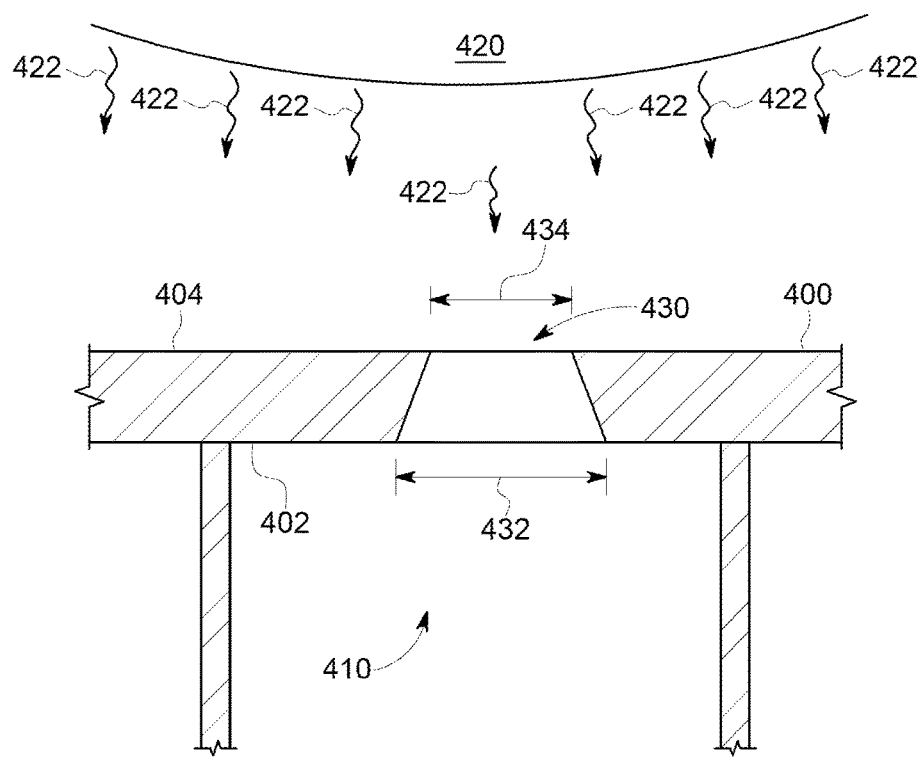
FIG. 4 illustrates a cross-section of a top plate formed in accordance with various embodiments.

FIG. 4 illustrates a cross-section of an example embodiment of a top plate 400 (e.g., which may be used as top plate 140) that may be used with pinhole collimator 130 in various embodiments. The top plate 400 includes a first surface 402 configured to be positioned proximate a semiconductor detector (e.g., semiconductor detector 110), or oriented toward an interior 410 of a collimator (e.g., pinhole collimator 130) including the top plate 400. The top plate 400 also includes a second surface 404 that is opposed to the first surface 402. The second surface 404 is farther away from the semiconductor detector than the first surface 402 is, or the second surface 404 is oriented toward an object 420 being imaged from which photons 422 are emitted. The top plate 400 includes pinhole openings 430 through which photons 422 pass toward the semiconductor detector. The depicted pinhole openings 430 each have a first width 432 at the first surface 402, and a second width 434 at the second surface 404. The first width 432 is greater than the second width 434. Accordingly, the pinhole openings 430 are tapered, and are larger at the first surface 402 than at the second surface 404. It may be noted that the taper orientation of the openings 430 in the plate 400 of FIG. 4 is opposite to the taper orientation of the openings 134 in the plate 140 of FIGS. 1-3. The tapered shape in various embodiments is configured to facilitate passage of photons over a preferred or desired angular range.

Figure 5:
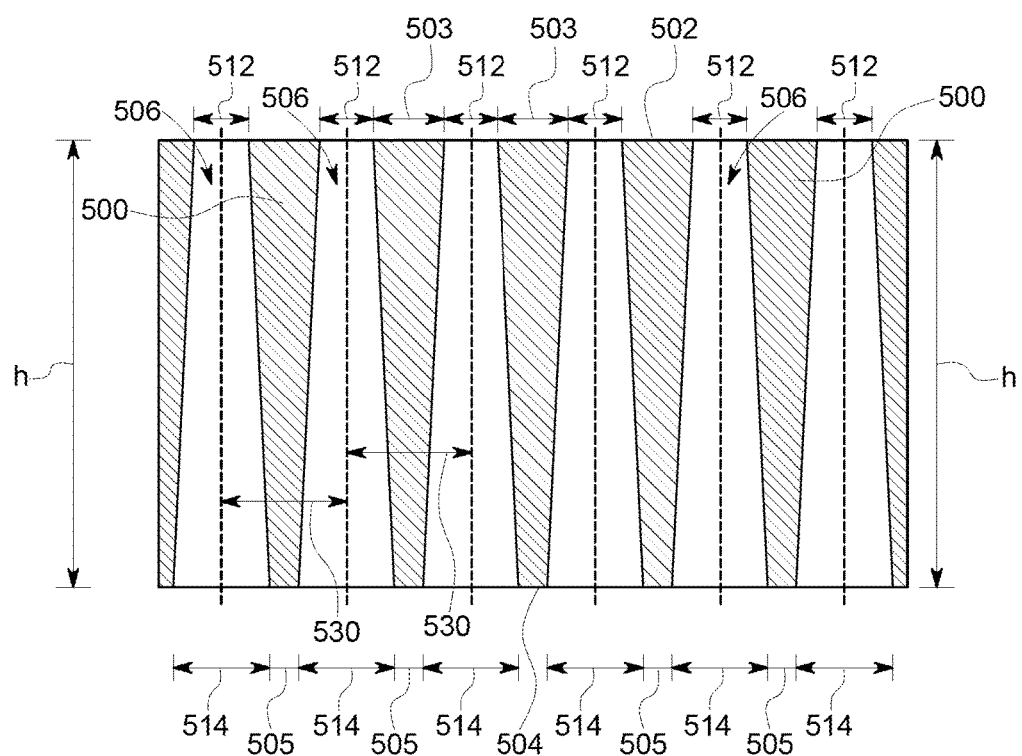
FIG. 5 illustrates a cross-section of pinhole collimator septa in accordance with various embodiments.

Alternatively or additionally, it may be noted that pinhole collimators in various embodiments may include tapered walls. FIG. 5 illustrates a cross-section of an example embodiment of pinhole collimator septa 500 that may be used with pinhole collimator 130 in various embodiments. Septa 500 include a first surface 502 proximate to a top plate (e.g., top plate 141, top plate 400; top plate not shown in FIG. 5), and a second surface 504 proximate to a semiconductor detector (e.g., semiconductor detector 110; semiconductor detector not shown in FIG. 5). Cells 506, through which photons pass, are defined between neighboring septa 500. The cells 506 are a first width 512 at the first surface 502, and a second width 514 at the second surface 504, with the second width 514 greater than the first width 512. Accordingly, a first width 503 of the septa 500 at the first surface 502 is greater than a second width 505 of the septa 500 at the second surface 504. In the illustrated embodiment, a pitch 530 is defined by the septa 500, with the first width 512 less than the pitch 530. The tapered septa 500 in various embodiments may cooperate or be complementary with tapered openings (e.g., openings 434). In various embodiments, the tapered septa 500 may be formed by 3D printing a collimator block. The tapered septa 500 provide additional thickness (e.g., relative to septa thickness of a parallel hole collimator) for improved reduction of penetration by photons into adjacent collimator cells. The tapered shape in various embodiments is configured to facilitate passage of photons over a preferred or desired angular range. It may be noted that while the description above includes top plate 141 or 400, the pinholes-array collimator of FIG. 5 may not include a top plate at all when opening 512 is in the desired size of the pinholes openings such as the size of openings 134 and 434 of FIGS. 4 and 1-3, respectively.

It may be noted that use of pinhole collimation (e.g., using pinhole collimator 130) in various embodiments provides for reduced overlap of solid angles defined by virtual sub-pixels, thereby providing for greater independence of equations defined by the virtual sub-pixels and improved imaging by improving spatial-resolution. For example, in some embodiments, solid viewing angles defined by virtual sub-pixels 117 via corresponding pinhole openings 134 have less overlapping than solid viewing angles defined by identical virtual sub-pixels via a parallel hole collimator having a sensitivity equal to a sensitivity of the pinhole collimator 130.

Examples of solid angles corresponding to the pinhole collimator 130 may be seen in FIG. 3. As seen in FIG. 3, the solid angles defined by virtual sub-pixels may vary based on a depth (or depths) within the semiconductor detector 110 assigned to events. For example, solid angles 320a, 320b, and 320c result from using a common absorption depth (e.g., $1/\mu$, where $\mu$ is an abortion coefficient) for events from three adjacent virtual sub-pixels 117. As another example, solid angles 330a, 330b, and 330c result from using varying absorption depths for events from three adjacent virtual sub-pixels 117. In FIG. 3, the cell width 148 between septa 142 of the pinhole collimator equals d, a height 149 of the pinhole collimator 130 is h/3, and the opening width 146 defined by the pinhole openings 134 is d/3.

Figure 6:
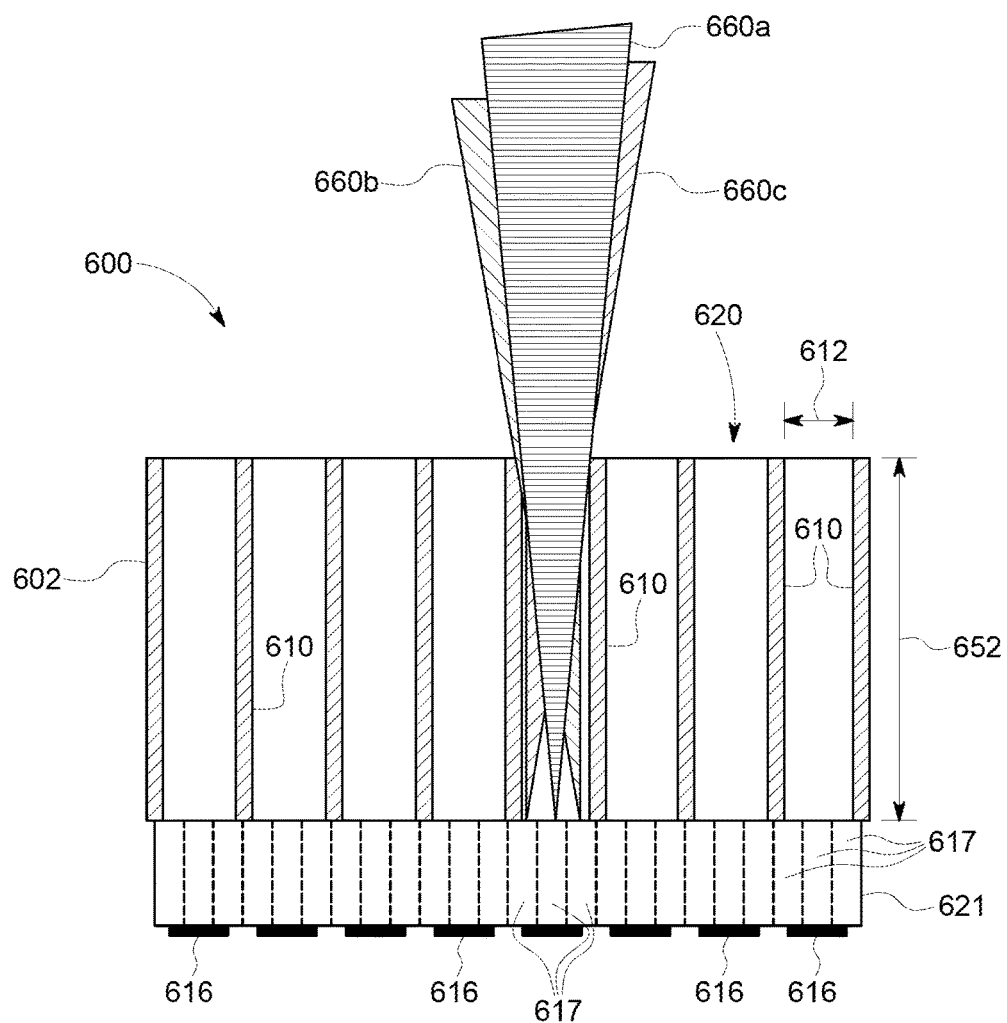
FIG. 6 depicts examples of solid angles corresponding to use of a parallel hole collimator.

By way of comparison, examples of solid angles corresponding to use of a parallel hole collimator may be seen in FIG. 6. In FIG. 6, a detector system 600 includes a parallel hole collimator 602 that includes walls 610 having a common opening width 612 therebetween. The opening width 612 defines the width of openings 620. The detector system 600 also includes a detector unit 621 that includes pixelated anodes 616 having virtual sub-pixels 617 associated therewith (e.g., by a processing unit). As seen in FIG. 6, solid angles 660a, 660b, and 660c result from using a common absorption depth (e.g., at the surface of the detector unit 621) for events from three adjacent virtual sub-pixels 617. As seen in FIGS. 3 and 6, the solid angles (solid angles 320a, 320b, and 320c and/or solid angles 330a, 330b, and 330c) for the pinhole collimator 130 have noticeably less overlap than the solid angles for parallel hole collimator 602 (solid angles 660a, 660b, and 660c). In FIG. 6, the width 612 between walls (as well as width of openings 620) is d, and the height 652 of the parallel hole collimator 602 is h.

It may be noted that the sensitivity of a detector system using a collimator corresponds to an aspect ratio defined by the ratio of the width of a collimator opening to the height of the collimator. Accordingly, for the example embodiment illustrated in FIG. 3, the aspect ratio is (d/3)/(h/3), or d/h. Similarly for the parallel hole example of FIG. 6, the aspect ratio is d/h. Accordingly, the collimators of FIG. 6 and FIG. 3 have identical aspect ratios and provide similar sensitivities; however, the collimator of FIG. 3 has a much shorter height (⅓ of the height of the collimator of FIG. 6). The pinhole collimator 130 in various embodiments accordingly provides various benefits when compared to conventional parallel hole collimator arrangements. For example, as discussed herein, the pinhole collimator 130 provides solid viewing angles that are more tilted and have less overlap than solid viewing angles of a parallel hole collimator, thereby providing better information for reconstruction of an image and resulting in improved spatial resolution. The improved spatial resolution capabilities in some embodiments may be used to improve sensitivity while maintaining a same or similar spatial resolution. Also, shorter collimator height allows for a more compact detector head, allowing for more detector heads to be used, to provide greater ranges of movement (e.g., rotation) of detector heads, and to reduce or eliminate collisions or interference between neighboring detector heads.

Returning to FIGS. 1-3, the processing unit 150 is operably coupled to the semiconductor detector 110, and is configured to identify detected events, deriving the location of events within physical pixels 119 and based on their location, assigning them to virtual sub-pixels 117 distributed along a length 190 and width 191 of the semiconductor detector 110 to be counted there. In FIG. 3, the virtual sub-pixels 117 are represented by dashed lines passing through the semiconductor detector corresponding to the location of the virtual sub-pixels 117. It may be noted that in the illustrated embodiment, the semiconductor detector 110 includes pixels 119. In FIG. 3, there are 3 virtual sub-pixels across a width of each pixel 119. Each pixel 119 may be understood as including a pixelated anode 116, with each pixelated anode 116 smaller (having a smaller area)

than the corresponding pixel 119. In the illustrated embodiment, there are 9 virtual sub-pixels 117 per pixelated anode 116 or pixel 119 (e.g., a grid of 3×3 virtual sub-pixels 117 per pixelated anode 116 or pixel 119). Each pixel 119 includes a plurality of corresponding virtual sub-pixels, with absorbed photons in the semiconductor detector 110 counted as events in a corresponding virtual sub-pixel. Additional discussion regarding virtual sub-pixels and the use of virtual sub-pixels, and the use of collected and non-collected charge signals may be found in U.S. patent application Ser. No. 14/724,022, entitled "Systems and Method for Charge-Sharing Identification and Correction Using a Single Pixel," filed 28 May 2015 ("the 022 Application); U.S. patent application Ser. No. 15/280,640, entitled "Systems and Methods for Sub-Pixel Location Determination," filed 29Sep. 2016 ("the 640 Application"); and U.S. patent application Ser. No. 14/627,436, entitled "Systems and Methods for Improving Energy Resolution by Sub-Pixel Energy Calibration," filed 20 Feb. 2015 ("the 436 Application). The subject matter of each of the 022 Application, the 640 Application, and the 436 Application are incorporated by reference in its entirety.

In various embodiments the processing unit 150 includes processing circuitry configured to perform one or more tasks, functions, or steps discussed herein. It may be noted that "processing unit" as used herein is not intended to necessarily be limited to a single processor or computer. For example, the processing unit 150 may include multiple processors, ASIC's, FPGA's, and/or computers, which may be integrated in a common housing or unit, or which may distributed among various units or housings. It may be noted that operations performed by the processing unit 150 (e.g., operations corresponding to process flows or methods discussed herein, or aspects thereof) may be sufficiently complex that the operations may not be performed by a human being within a reasonable time period. For example, the determination of values of collected, non-collected, and/or combined charge signals within the time constraints associated with such signals may rely on or utilize computations that may not be completed by a person within a reasonable time period.

As discussed, herein, signals are generated by one or more pixelated anodes 116 in response to a photon impact, with the location of the pixelated anode(s) 116 generating a signal used to determine a corresponding location in the object for which an event is counted. In various embodiments, as also discussed in the 022 Application, the 640 Application, and the 436 Application, signals from adjacent pixels may be used to assign a virtual sub-pixel location within a given pixelated anode 116. In some embodiments, the processing unit 150 is configured to determine an absorption location for a given absorbed phone based on non-collected signals received from pixelated anodes adjacent to a pixelated anode absorbing the given absorbed photon.

Additionally or alternatively to the use of virtual pixels along a length and/or width of the semiconductor detector 110, in various embodiments virtual pixels may be employed along a thickness of the semiconductor detector 110. Virtual pixels employed along a thickness of the semiconductor detector 110 may be used to represent different depths of absorption of photons. For example, in various embodiments, as best seen in FIG. 3, the semiconductor detector 110 has a thickness 396. Three rows of virtual pixels are distributed along the thickness 396—a first row 390, a second row 392, and a third row 394. The processing unit 150 in various embodiments is configured to identify detector events with the virtual sub-pixels in the first row 390, second row 392, and third row 394 distributed along the thickness 396. Accordingly, in various embodiments, different virtual sub-pixels along a thickness may be used to provide different absorption depths for identifying event locations. For example, as seen in FIG. 3, event 331a is shown at a depth corresponding to the first row 390, event 331b is shown at a depth corresponding to the third row 394, and event 331c is shown at a depth corresponding to the second row 392.

However, it may be noted that, in other embodiments that may or may not include a pinhole-array collimator, a single absorption depth may be employed. For example, in some embodiments, the processing unit 150 is configured to count absorbed photons as events within the thickness 396 of the semiconductor detector 110 at a location (e.g., a distance from the cathode 118) corresponding to one over an absorption coefficient of the semiconductor detector 110. For example, with u as the absorption coefficient, photons (e.g., photons at a given energy corresponding with the absorption coefficient) may be counted as events at a location in the semiconductor detector a distance 395 from the second surface 112 (and/or cathode 118) along the thickness 396, as shown for event locations 321a, 321b, and 321c of FIG. 3. The distance 395 in various embodiments is $1/\mu$. It may be noted that $\mu$ may vary based on photon energy. It may further be noted that use of a single absorption depth as discussed herein and in the next paragraph may be used in connection with a pinhole collimator (e.g., pinhole collimator 130) in various embodiments, or may be used in connection with a parallel hole collimator (e.g., parallel hole collimator 602) in other embodiments. In some embodiments, the absorption location for each photon is defined within a range of $1/\mu \pm 1$ millimeter.

As another example of use of a single absorption depth, in some embodiments, the processing unit 150 is configured to count absorbed photons as events within the thickness 396 of the semiconductor detector 110 at a distance corresponding to an energy window width used to identify the events as photon impacts. For example, in some embodiments, an absorption location for each absorbed photon within the thickness 396 of the semiconductor detector 110 is defined within a range such that $\Delta L/D = \Delta E/E$, where $\Delta L$ is the distance 395 from the first surface 112 (and/or the cathode 118), D is the detector thickness (e.g., thickness 396), $\Delta E$ is an energy window width, and E is a photopeak energy of an absorbed photon. The energy window width in various embodiments is a range of energies around the photopeak energy which are considered as true events.

Figure 7:
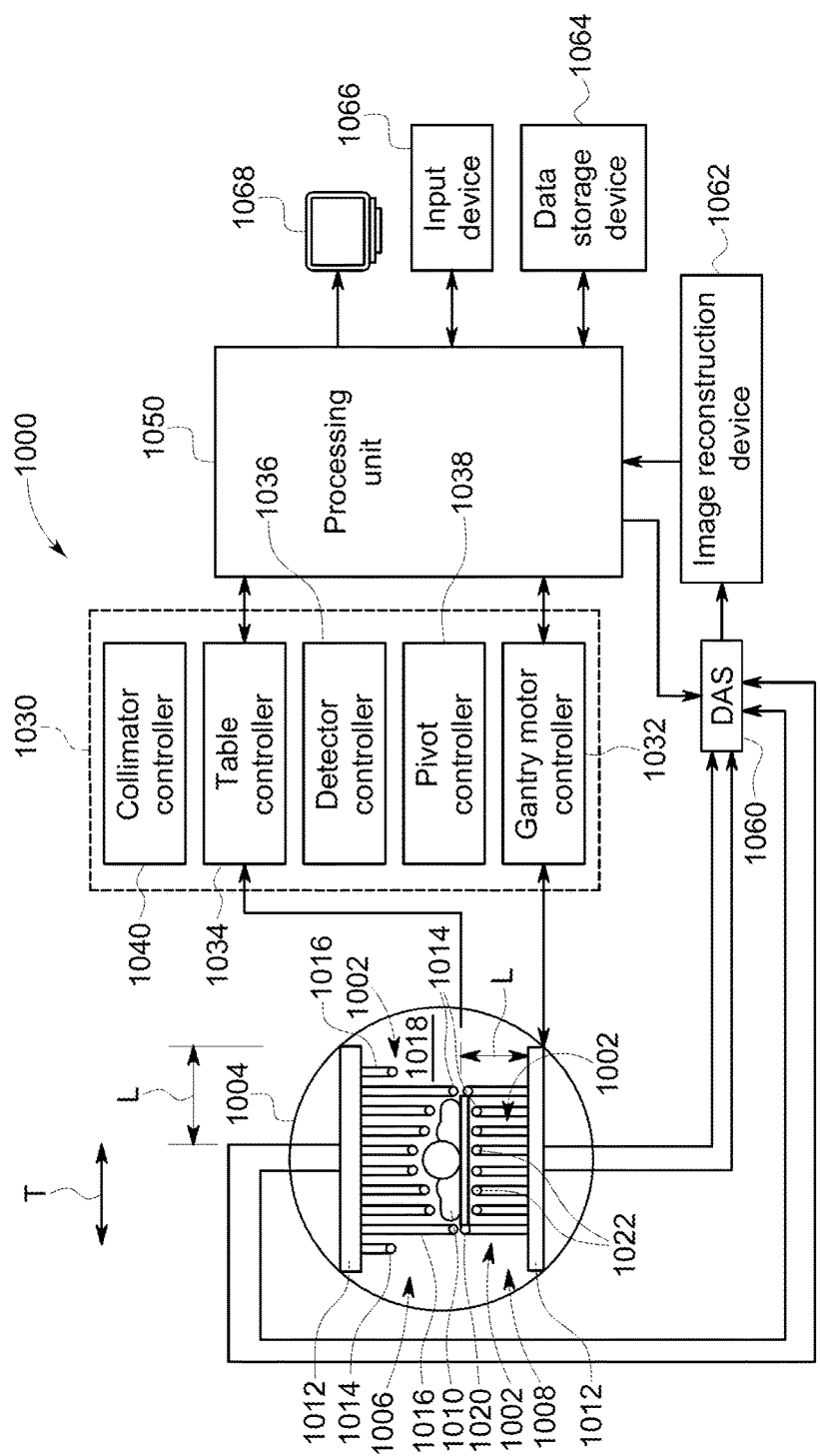
FIG. 7 is a schematic block diagram of a Nuclear Medicine (NM) imaging system in accordance with various embodiments.

FIG. 7 is a schematic illustration of a NM imaging system 1000 having a plurality of imaging detector head assemblies mounted on a gantry (which may be mounted, for example, in rows, in an iris shape, or other configurations, such as a configuration in which the movable detector carriers 1016 are aligned radially toward the patient-body 1010). In particular, a plurality of imaging detectors 1002 are mounted to a gantry 1004. Each detector 1002 may include, for example, collimators and detectors arranged generally similarly to the arrangements discussed in connection with FIGS. 1-6 and/or FIGS. 9-19. In the illustrated embodiment, the imaging detectors 1002 are configured as two separate detector arrays 1006 and 1008 coupled to the gantry 1004 above and below a subject 1010 (e.g., a patient), as viewed in FIG. 7. The detector arrays 1006 and 1008 may be coupled directly to the gantry 1004, or may be coupled via support members 1012 to the gantry 1004 to allow movement of the entire arrays 1006 and/or 1008 relative to the gantry 1004 (e.g., transverse translating movement in the left or right direction as viewed by arrow T in FIG. 7). Additionally, each of the imaging detectors 1002 includes a detector unit 1014 (which may include collimator and/or detector assemblies as discussed herein in connection with FIGS. 1-6), at least some of which are mounted to a movable detector carrier 1016 (e.g., a support arm or actuator that may be driven by a motor to cause movement thereof) that extends from the gantry 1004. In some embodiments, the detector carriers 1016 allow movement of the detector units 1014 towards and away from the subject 1010, such as linearly. Thus, in the illustrated embodiment the detector arrays 1006 and 1008 are mounted in parallel above and below the subject 1010 and allow linear movement of the detector units 1014 in one direction (indicated by the arrow L), illustrated as perpendicular to the support member 1012 (that are coupled generally horizontally on the gantry 1004). However, other configurations and orientations are possible as described herein. It should be noted that the movable detector carrier 1016 may be any type of support that allows movement of the detector units 1014 relative to the support member 1012 and/or gantry 1004, which in various embodiments allows the detector units 1014 to move linearly towards and away from the support member 1012.

Each of the imaging detectors 1002 in various embodiments is smaller than a conventional whole body or general purpose imaging detector. A conventional imaging detector may be large enough to image most or all of a width of a patient's body at one time and may have a diameter or a larger dimension of approximately 50 cm or more. In contrast, each of the imaging detectors 1002 may include one or more detector units 1014 coupled to a respective detector carrier 1016 and having dimensions of, for example, 4 cm to 20 cm and may be formed of Cadmium Zinc Telluride (CZT) tiles or modules. For example, each of the detector units 1014 may be 8×8 cm in size and be composed of a plurality of CZT pixelated modules (not shown). For example, each module may be 4×4 cm in size and have 16×16=256 pixels. In some embodiments, each detector unit 1014 includes a plurality of modules, such as an array of 1×7 modules. However, different configurations and array sizes are contemplated including, for example, detector units 1014 having multiple rows of modules.

It should be understood that the imaging detectors 1002 may be different sizes and/or shapes with respect to each other, such as square, rectangular, circular or other shape. An actual field of view (FOV) of each of the imaging detectors 1002 may be directly proportional to the size and shape of the respective imaging detector.

The gantry 1004 may be formed with an aperture 1018 (e.g., opening or bore) therethrough as illustrated. A patient table 1020, such as a patient bed, is configured with a support mechanism (not shown) to support and carry the subject 1010 in one or more of a plurality of viewing positions within the aperture 1018 and relative to the imaging detectors 1002. Alternatively, the gantry 1004 may comprise a plurality of gantry segments (not shown), each of which may independently move a support member 1012 or one or more of the imaging detectors 1002.

The gantry 1004 may also be configured in other shapes, such as a "C", "H" and "L", for example, and may be rotatable about the subject 1010. For example, the gantry 1004 may be formed as a closed ring or circle, or as an open arc or arch which allows the subject 1010 to be easily accessed while imaging and facilitates loading and unloading of the subject 1010, as well as reducing claustrophobia in some subjects 1010.

Additional imaging detectors (not shown) may be positioned to form rows of detector arrays or an arc or ring around the subject 1010. By positioning multiple imaging detectors 1002 at multiple positions with respect to the subject 1010, such as along an imaging axis (e.g., head to toe direction of the subject 1010) image data specific for a larger FOV may be acquired more quickly.

Each of the imaging detectors 1002 has a radiation detection face, which is directed towards the subject 1010 or a region of interest within the subject.

In various embodiments, multi-bore collimators may be constructed to be registered with pixels of the detector units 1014, which in one embodiment are CZT detectors. However, other materials may be used. Registered collimation may improve spatial resolution by forcing photons going through one bore to be collected primarily by one pixel. Additionally, registered collimation may improve sensitivity and energy response of pixelated detectors as detector area near the edges of a pixel or in-between two adjacent pixels may have reduced sensitivity or decreased energy resolution or other performance degradation. Having collimator septa directly above the edges of pixels reduces the chance of a photon impinging at these degraded-performance locations, without decreasing the overall probability of a photon passing through the collimator. As discussed herein, in various embodiments parallel-hole and/or pin-hole collimation may be employed.

A controller unit 1030 may control the movement and positioning of the patient table 1020, imaging detectors 1002 (which may be configured as one or more arms), gantry 1004 and/or the collimators 1022 (that move with the imaging detectors 1002 in various embodiments, being coupled thereto). A range of motion before or during an acquisition, or between different image acquisitions, is set to maintain the actual FOV of each of the imaging detectors 1002 directed, for example, towards or "aimed at" a particular area or region of the subject 1010 or along the entire subject 1010. The motion may be a combined or complex motion in multiple directions simultaneously, concurrently, or sequentially as described in more detail herein.

The controller unit 1030 may have a gantry motor controller 1032, table controller 1034, detector controller 1036, pivot controller 1038, and collimator controller 1040. The controllers 1030, 1032, 1034, 1036, 1038, 1040 may be automatically commanded by a processing unit 1050, manually controlled by an operator, or a combination thereof. The gantry motor controller 1032 may move the imaging detectors 1002 with respect to the subject 1010, for example, individually, in segments or subsets, or simultaneously in a fixed relationship to one another. For example, in some embodiments, the gantry controller 1032 may cause the imaging detectors 1002 and/or support members 1012 to move relative to or rotate about the subject 1010, which may include motion of less than or up to 180 degrees (or more).

The table controller 1034 may move the patient table 1020 to position the subject 1010 relative to the imaging detectors 1002. The patient table 1020 may be moved in up-down directions, in-out directions, and right-left directions, for example. The detector controller 1036 may control movement of each of the imaging detectors 1002 to move together as a group or individually as described in more detail herein. The detector controller 1036 also may control movement of the imaging detectors 1002 in some embodiments to move closer to and farther from a surface of the subject 1010, such as by controlling translating movement of the detector carriers 1016 linearly towards or away from the subject 1010 (e.g., sliding or telescoping movement).

Optionally, the detector controller 1036 may control movement of the detector carriers 1016 to allow movement of the detector array 1006 or 1008. For example, the detector controller 1036 may control lateral movement of the detector carriers 1016 illustrated by the T arrow (and shown as left and right as viewed in FIG. 7). In various embodiments, the detector controller 1036 may control the detector carriers 1016 or the support members 1012 to move in different lateral directions. Detector controller 1036 may control the swiveling motion of detectors 1002 together with their collimators 1022.

The pivot controller 1038 may control pivoting or rotating movement of the detector units 1014 at ends of the detector carriers 1016 and/or pivoting or rotating movement of the detector carrier 1016. For example, one or more of the detector units 1014 or detector carriers 1016 may be rotated about at least one axis to view the subject 1010 from a plurality of angular orientations to acquire, for example, 3D image data in a 3D SPECT or 3D imaging mode of operation. The collimator controller 1040 may adjust a position of an adjustable collimator, such as a collimator with adjustable strips (or vanes) or adjustable pinhole(s).

It should be noted that motion of one or more imaging detectors 1002 may be in directions other than strictly axially or radially, and motions in several motion directions may be used in various embodiment. Therefore, the term "motion controller" may be used to indicate a collective name for all motion controllers. It should be noted that the various controllers may be combined, for example, the detector controller 1036 and pivot controller 1038 may be combined to provide the different movements described herein.

Prior to acquiring an image of the subject 1010 or a portion of the subject 1010, the imaging detectors 1002, gantry 1004, patient table 1020 and/or collimators 1022 may be adjusted, such as to first or initial imaging positions, as well as subsequent imaging positions. The imaging detectors 1002 may each be positioned to image a portion of the subject 1010. Alternatively, for example in a case of a small size subject 1010, one or more of the imaging detectors 1002 may not be used to acquire data, such as the imaging detectors 1002 at ends of the detector arrays 1006 and 1008, which as illustrated in FIG. 7 are in a retracted position away from the subject 1010. Positioning may be accomplished manually by the operator and/or automatically, which may include using, for example, image information such as other images acquired before the current acquisition, such as by another imaging modality such as X-ray Computed Tomography (CT), MRI, X-Ray, PET or ultrasound. In some embodiments, the additional information for positioning, such as the other images, may be acquired by the same system, such as in a hybrid system (e.g., a SPECT/CT system). Additionally, the detector units 1014 may be configured to acquire non-NM data, such as x-ray CT data. In some embodiments, a multi-modality imaging system may be provided, for example, to allow performing NM or SPECT imaging, as well as x-ray CT imaging, which may include a dual-modality or gantry design as described in more detail herein.

After the imaging detectors 1002, gantry 1004, patient table 1020, and/or collimators 1022 are positioned, one or more images, such as three-dimensional (3D) SPECT images are acquired using one or more of the imaging detectors 1002, which may include using a combined motion that reduces or minimizes spacing between detector units 1014. The image data acquired by each imaging detector 1002 may be combined and reconstructed into a composite image or 3D images in various embodiments.

In one embodiment, at least one of detector arrays 1006 and/or 1008, gantry 1004, patient table 1020, and/or collimators 1022 are moved after being initially positioned, which includes individual movement of one or more of the detector units 1014 (e.g., combined lateral and pivoting movement) together with the swiveling motion of detectors 1002. For example, at least one of detector arrays 1006 and/or 1008 may be moved laterally while pivoted. Thus, in various embodiments, a plurality of small sized detectors, such as the detector units 1014 may be used for 3D imaging, such as when moving or sweeping the detector units 1014 in combination with other movements.

In various embodiments, a data acquisition system (DAS) 1060 receives electrical signal data produced by the imaging detectors 1002 and converts this data into digital signals for subsequent processing. However, in various embodiments, digital signals are generated by the imaging detectors 1002. An image reconstruction device 1062 (which may be a processing device or computer) and a data storage device 1064 may be provided in addition to the processing unit 1050. It should be noted that one or more functions related to one or more of data acquisition, motion control, data processing and image reconstruction may be accomplished through hardware, software and/or by shared processing resources, which may be located within or near the imaging system 1000, or may be located remotely. Additionally, a user input device 1066 may be provided to receive user inputs (e.g., control commands), as well as a display 1068 for displaying images. DAS 1060 receives the acquired images from detectors 1002 together with the corresponding lateral, vertical, rotational and swiveling coordinates of gantry 1004, support members 1012, detector units 1014, detector carriers 1016, and detectors 1002 for accurate reconstruction of an image including 3D images and their slices.

Figure 8:
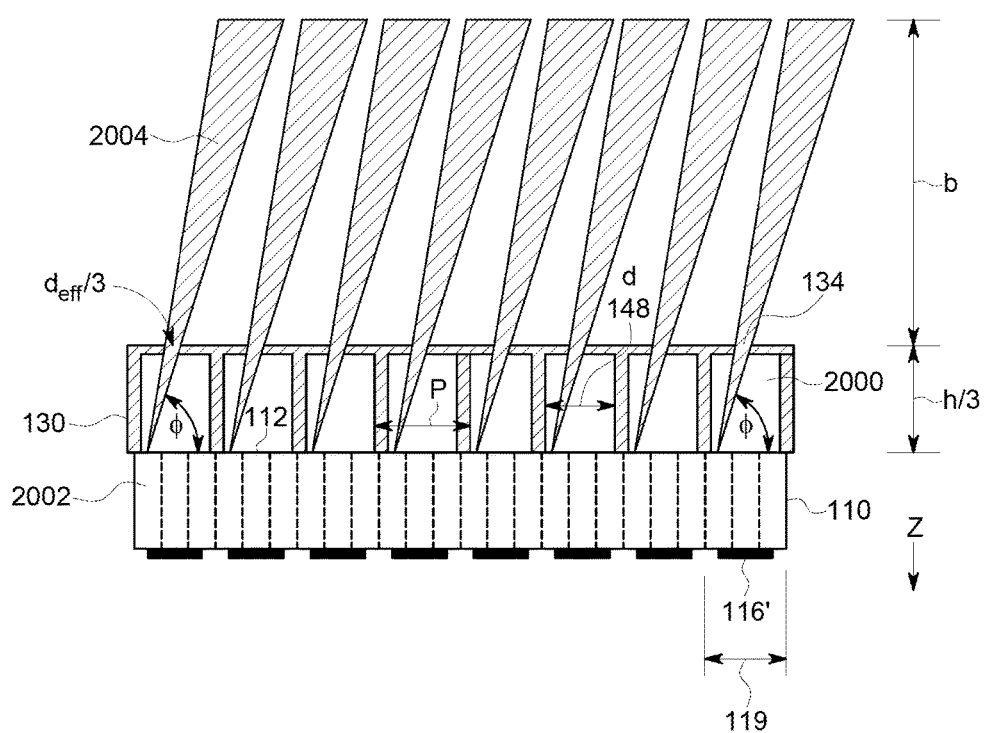
FIG. 8 schematically shows parallel viewing angles of virtual sub-pixels in a configuration of detector assembly that is similar to FIG. 3 but has one layer of virtual sub-pixels in a Z direction.

FIG. 8 illustrates a detector assembly that is similar to the detector assembly illustrated by FIG. 3 with the exception that the virtual sub-pixels of FIG. 8 are arranged in one layer along a Z direction. In addition to FIG. 3, FIG. 8 specifically refers to collimator cells 2000, with each collimator cell confining a single pixel 119 (and corresponding pixelated anode 116), and includes a single pinhole 134. Each physical pixel 119 has size P that is equal to the pitch of the pixels 116, pinholes 134 and cells 2000. Each pixel 119 is divided into multiple virtual sub-pixels 2002. FIG. 8 shows viewing angles 2004 as observed from virtual sub-pixels 2002 via pinholes 134 to the object being imaged (not shown). Each viewing angle 2004 belong to a different cell 2000. In each cell 2000, the relative position between each virtual pixel 2002 corresponding to viewing angle 2004 and pinhole 134 is the same. Accordingly all the viewing angles 2004 form the same angle $\phi$ with the first surface 112 and thus, are parallel to each other and are displaced from each other by a distance that is equal to the pitch of pixels 119 and pinholes 134.

The discussion about the system (detector assembly 100) spatial-resolution will be divided into two steps: The first step analyzes the system spatial-resolution for a single cell 2000 and the second step analyzes the system-spatial resolution for an array of multiple cells 2000 closely packed and butted together into a matrix of cells (collimator 130) that each of them includes a single pinhole 134 and confines a single pixels 116.

System Spatial-Resolution for a Single Cell 2000:

For a single cell 2000, the system spatial-resolution is given by:

$$R_s = \sqrt{(R_c)^2 + (r_i \cdot M)^2} = \sqrt{\left((d/3) \cdot \frac{(h/s+b)}{h/3}\right)^2 + \left(r_i \cdot \frac{b}{h/3}\right)^2} \quad \text{Equation (1)}$$

When $R_s$ is the system spatial-resolution, $R_c$ is the collimator (cell 2000) spatial-resolution, d is distance 148 between the walls of cells 2000, d/3 is the opening size of pinhole 134, h/3 is the the height of collimator 130, b is the distance from collimator 130 to the object being imaged (not shown), $r_i$ is the intrinsic resolution of virtual sub-pixels 2002 and is equal to the size of virtual sub-pixels 2002, and M is the magnification of cell 2000 in collimator 130 and M=b/(h/3)

System Spatial-Resolution for an Array of Cells 2000:

As explained above for collimator 130 including multiple cells 2000, parallel viewing angles 2004 are displaced from each other by a distance P, which defines the intrinsic resolution in parallel collimation.

Accordingly, for an array of cells 2000, the system spatial-resolution is given by:

$$R_s = \sqrt{(R_c)^2 + (P)^2} = \sqrt{\left((d/3) \cdot \frac{(h/3+b)}{h/3}\right)^2 + (P)^2} \quad \text{Equation (2)}$$

Accordingly, the system spatial-resolution is the smaller value derived either from Equation (1) or Equation (2).

For conventional pinhole collimator, the mathematical term $r_i*M$ in Equation (1), which represent the contribution of the intrinsic resolution of the detector to the system spatial-resolution, is replaced by the mathematical term P×M, where P is the physical size of pixels 119 that is also equal to the pitch between the physical pixels 119. According to FIG. 8, each cell 2000 having a single opening 134 above a single physical pixel 119. The pitch P between the physical pixels 119 is equal to the pitch between pinholes 134 corresponding to adjacent cells 2000 in the array of cells 2000 in collimator 130, with each cell 2000 above a single physical pixel 119. Physical pixels 119 have size P and include multiple virtual sub-pixels 2002 having size $r_i$. Accordingly, P»$r_i$ and the system spatial resolution according to the invention is better than that of a conventional pinhole collimator.

The magnification M=b/(h/3) that appears in Equation (1) is the ratio between the distance b from the collimator to the imaged object and the collimator height (h/3). For large distances b of the object being imaged from the collimator, M is large. Accordingly, the value of the system spatial-resolution according to Equation (1) may be larger than the one according to Equation (2), and then the system spatial-resolution is determined by Equation (2). For short distances b of the object being imaged from the collimator, M is small, and, accordingly, the value of the system spatial-resolution according to Equation (1) may be smaller than the one according to Equation (2) and then the system spatial-resolution is determined by Equation (1).

This means that unlike conventional pinhole collimator having a pinhole above multiple physical pixels, the system spatial-resolution of pinhole collimator 130 in accordance with various embodiments herein is the smaller of the system spatial-resolution as derived either by Equations (1) or (2).

In general, for system spatial-resolution $R_S$, collimator spatial-resolution $R_c$, height h of collimator 130, distance b of the object being imaged from collimator 130, opening d of pinhole 134, size $r_i$ of virtual sub-pixel 2002, and size and pitch P of physical pixel 119, the condition in the paragraph above can be formulated as follows:

$$R_S = \sqrt{(R_C)^2 + (C)^2} \quad \text{Equation (3)}$$

When C gets the smaller value of either:

$$\left(n \cdot \frac{b}{h}\right)$$

or P

It can be seen that various embodiments have superior system spatial-resolution, relative to conventional pinhole collimator, for the following reasons: (1) The virtual sub-pixels 2002 have smaller size than the physical pixels 119. (2) The system spatial resolution is the smaller of the one derived either from Equations (1) or (2).

When the object being imaged is close to collimator 130, the term $r_i \times M$ is smaller than P. For this situation, the system spatial-resolution according to various embodiments is better than this of a parallel hole collimator. When the object being imaged is far from the collimator, P is smaller than the term $r_i \times M$. For this situation, the system spatial-resolution according to the embodiments of the invention is better than this of a conventional pinhole collimator. Thereby the embodiments of the invention provide better image quality and spatial resolution than both, parallel-holes collimator and pinholes collimator.

Various embodiments discussed above have included the use of virtual sub-pixels. It may be noted that, in other embodiments, physical, real, or actual sub-pixellization may be employed. Physical sub-pixels, as used herein, may be understood as individual pixelated anodes of a radiation detector that are grouped together into multiple groups, and each group of pixelated anodes shares a common collimator opening in a configuration where each group of the groups of the pixelated anodes receives radiation via a corresponding single and only one collimator opening. It may be noted that, when physical sub-pixels are used, charge-sharing effects may be significant. Accordingly, various embodiments discussed herein provide charge-sharing recovery.

FIGS. 9-14 depict various aspects of a detector assembly 1390 (illustrated by FIG. 12) in accordance with various embodiments. The detector assembly 1390 is generally similar in various respects to the detector assembly 100 discussed in connection with FIGS. 1-5, and may utilize various components or aspects discussed in connection with the detector assembly 100 (e.g., a similar collimator), but uses physical sub-pixels instead of virtual sub-pixels. Generally, the detector assembly 1390 includes a semiconductor detector 1312, a pinhole collimator 1300, and a processing unit 1410 (schematically shown as electrically connected to pixels 1308). Radiation emitted from an object being detected passes through the pinhole collimator 1300 and is received by the semiconductor detector 1312, which generates signals responsive to the received radiation. The signals are provided to the processing unit 1410, which uses the signals to determine counts corresponding to emitted radiation from the object being image. The counts may be used to reconstruct an image.

Figure 9:
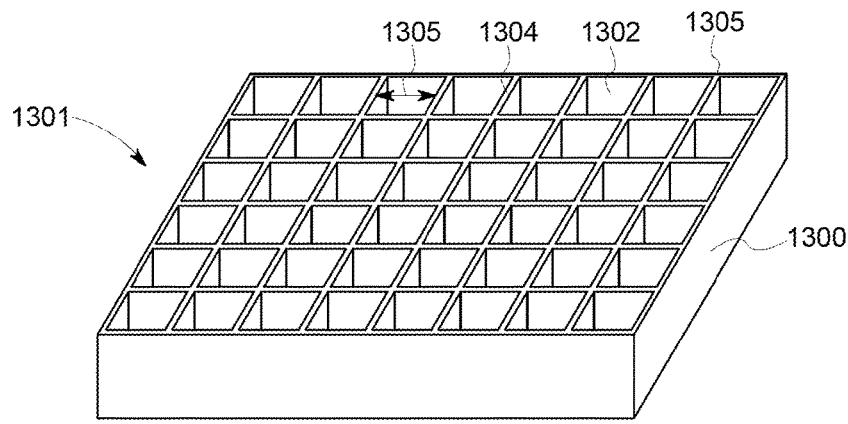
FIG. 9 illustrates a bottom view of a collimator formed in accordance with various embodiments.
Figure 10:
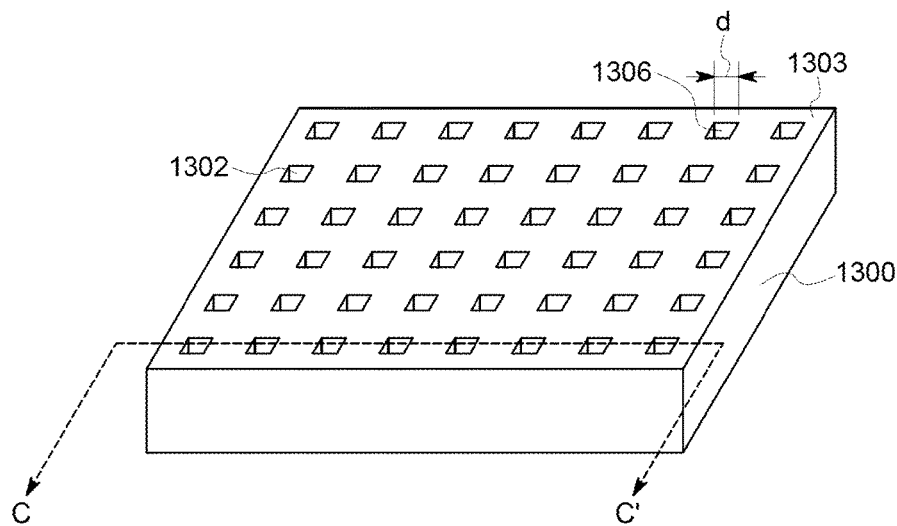
FIG. 10 illustrates a top view of the collimator of FIG. 9.
Figure 11:
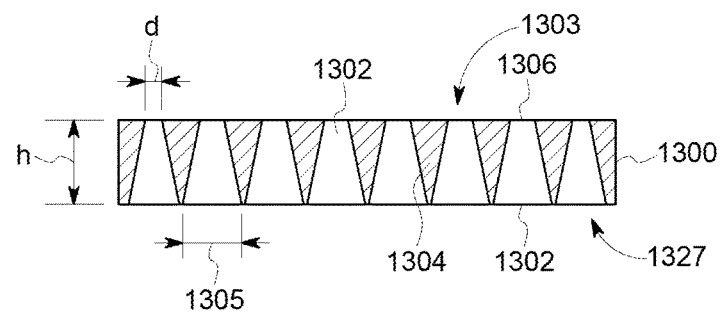
FIG. 11 illustrates a side sectional view of the collimator of FIG. 9.

FIG. 9 provides a bottom view (showing the side of the collimator closest to the detector) of the pinhole collimator 1300, FIG. 10 provides a top view of the collimator 1300 (showing the side of the collimator closes to the object being imaged), and FIG. 11 provides a side sectional view of the pinhole collimator 1300. As seen in FIGS. 9-11, the pinhole collimator 300 includes an array 1301 of pinhole openings 1302 that correspond to the pixelated anodes 1308. Each pinhole opening 1302 corresponds to a corresponding group of pixelated anodes 1308 (see, e.g., FIGS. 12-13 and related discussion). An area of each pinhole opening 1302 (e.g., the area at the surface closest to the object being imaged) is smaller than a corresponding radiation receiving area of the corresponding group of pixelated anodes 1308. For example, when four pixelated anodes form the group corresponding to a given collimator opening, the area of the collimator opening is smaller than the combined radiation receiving area defined by the four pixelated anodes.

The pinhole openings 1302 may be understood as being tapered. For example, as seen in FIGS. 9-11, the pinhole openings 1302 are tapered, with the pinhole openings 1302 being larger on a first surface 1327 that is proximate the semiconductor detector 1312 than on a second surface 1303 that is opposed to the first surface 1307 and farther away from the semiconductor detector 1312.

It may further be noted that in various embodiments, the collimator 1300 may be a 3D printed collimator. Such a 3D printed collimator provides various advantages in various embodiments. For example, such a collimator may be produced with high accuracy to facilitate accurate registration of the collimator to groups of physical sub-pixels (e.g., a certain group of pixelated anodes sharing a single and only one common collimator opening). Additionally, such collimators may be produced at a relatively low cost.

However, it may be noted that materials used for 3D printed collimators may have a lower density than collimators produced using the same material (e.g., Tungsten) but fabricated using other methods, and, accordingly, may provide reduced penetration protection relative to other fabrication methods. To address the lower density of the material, the septa of the collimator may be made thicker to help prevent radiation penetration via septa 1304 from a volume under one opening of the collimator opening to another volume under another opening. Thicker septa using parallel holes may reduce sensitivity; however, various embodiments utilize tapered pinhole openings to provide improved sensitivity for thicker walled septa.

For example, as seen in FIGS. 9-11, the depicted pinhole collimator 1300 with thicker septa 1304 provides comparable sensitivity and spatial resolution achieved by a parallel-hole collimator having relatively thinner septa. The openings 1302 have narrow upper sides 1306 having a width d, and wider lower portions 1305.

Figure 12:
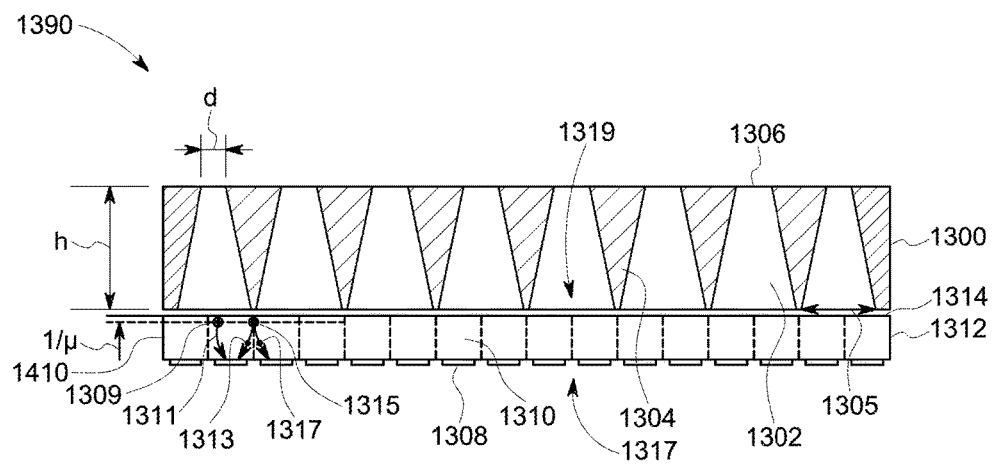
FIG. 12 illustrates a detection system formed in accordance with with various embodiments.
Figure 13:
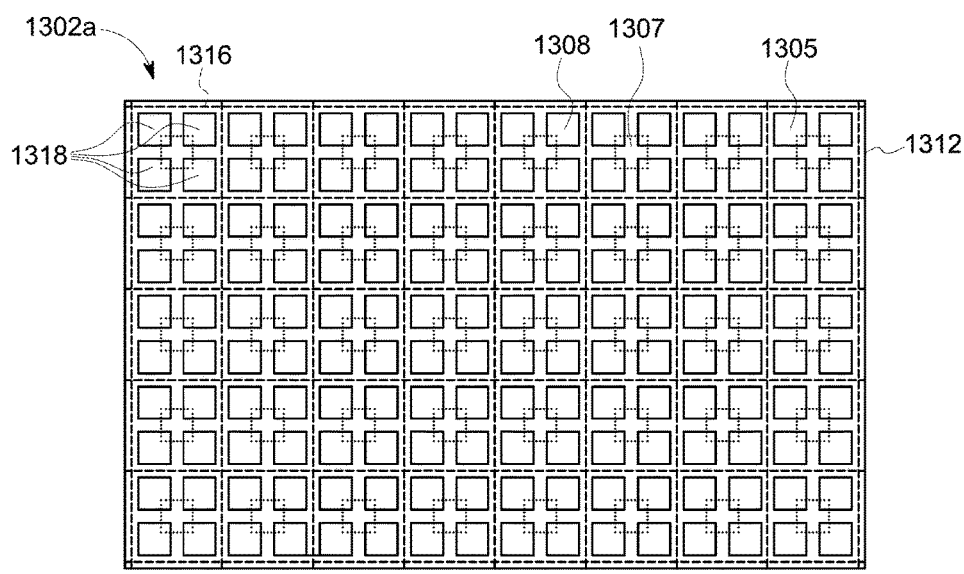
FIG. 13 illustrates a top view of a detector formed in accordance with accordance with various embodiments.

As best seen in FIGS. 12-13, the semiconductor detector 1312 has a first surface 1317 and a second surface 1319. The first surface 1317 and the second surface 1309 are opposed to each other, with the first surface 1317 including pixelated anodes 1308, and the second surface 1319 including a cathode electrode 1314. As discussed herein, the detector assembly 1390 utilizes physical sub-pixelation.

It may be noted that virtual sub-pixelation may provide challenges with respect to signal-to-noise ratio due to the relatively small magnitude of non-collected induced signals. Physical sub-pixelation may be used by dividing a pixel defined by a collimator opening into a group of physically distinct pixelated anodes (e.g., pixelated anodes 1308). In various embodiments, each group of pixelated anodes 1308 (with each individual group corresponding to a particular collimator opening) may include N×M pixelated anodes 1308, where N and M are integers greater than 1. In the illustrated embodiment, each group includes 2×2 pixelated anodes 1308. It may be noted that the use of physical sub-pixels may increase the effect of charge-sharing, which may be addressed as discussed herein. (See, e.g., FIG. 14 and related discussion.)

FIG. 12 provides a side view of the detector assembly 1390. As seen in FIG. 12, the collimator 1300 is disposed above (e.g., closer to the object being imaged) the cathode 1314 of a radiation detector 1312 made of a semiconductor (e.g., CdZnTe or CZT). The semiconductor detector 1312 includes the pixelated anodes 1308 which define corresponding sub-voxels 1310. As also seen in FIG. 12, the pinhole collimator 1300 has a height h and an opening width d at its upper surface.

FIG. 13 provides a schematic top view of the semiconductor 1312. Broken lines 1316 indicate the center of the septa 1304 of the pinhole collimator 1300 at the bottom surface of the pinhole collimator 1300. Squares 1307 defined by broken lines depict projections from the smaller size of the openings 1302 from the upper surface 1303 of the pinhole collimator 1300. For the example depicted in FIG. 13, one group 1318 of pixelated anodes 1308 corresponding to the opening in the upper left corner includes four pixelated anodes 1308 that correspond to a particular opening 1302a. Accordingly, each opening 1302 may be understood as being registered to a particular group 1318, with each pixelated anode 1308 of the group 1318 receiving radiation only from that corresponding opening 1302, with the septa 1304 blocking radiation from other openings.

As seen in FIG. 12, charge 1309 is created by a photon absorbed in the semiconductor detector 1312. The charge 1309 drifts along trajectory 1311 to be collected by a pixelated anode 1308. Charge 1315 is created by another photon absorbed in the semiconductor 1312 and is located in a range containing the border between adjacent pixelated anodes. In such a case, the charge 1315 is split into charges 1317 drifting along trajectories 1313 and is collected by two different pixelated anodes 1308, with neither pixelated anode collecting charge 1315 completely.

The smaller are the pixelated anodes 1308, the more they will be adversely affected by charge-sharing events. Due to the large number of pixelated anodes 1308 in detector 1312, which is in turn due to the small size of the pixelated anodes 1308, the use of a sub-pixel map may be unwieldy or impractical. Accordingly, various embodiments address charge-sharing.

It may be noted that, for image reconstruction, the Z coordinate or depth of interaction (DOI) should be known. However, grouping events according to their DOI may create groups having small numbers of events that accordingly may be adversely affected by statistical noise. Accordingly, in various embodiments, the processing unit 1410 counts absorbed photons as events with a thickness of the semiconductor detector 1312 at a distance corresponding to $1/\mu$, where $\mu$ is the absorption coefficient of the semiconductor detector. For example, the events may be counted as being with a range of $1/\mu$ plus or minus one millimeter.

Figure 14:
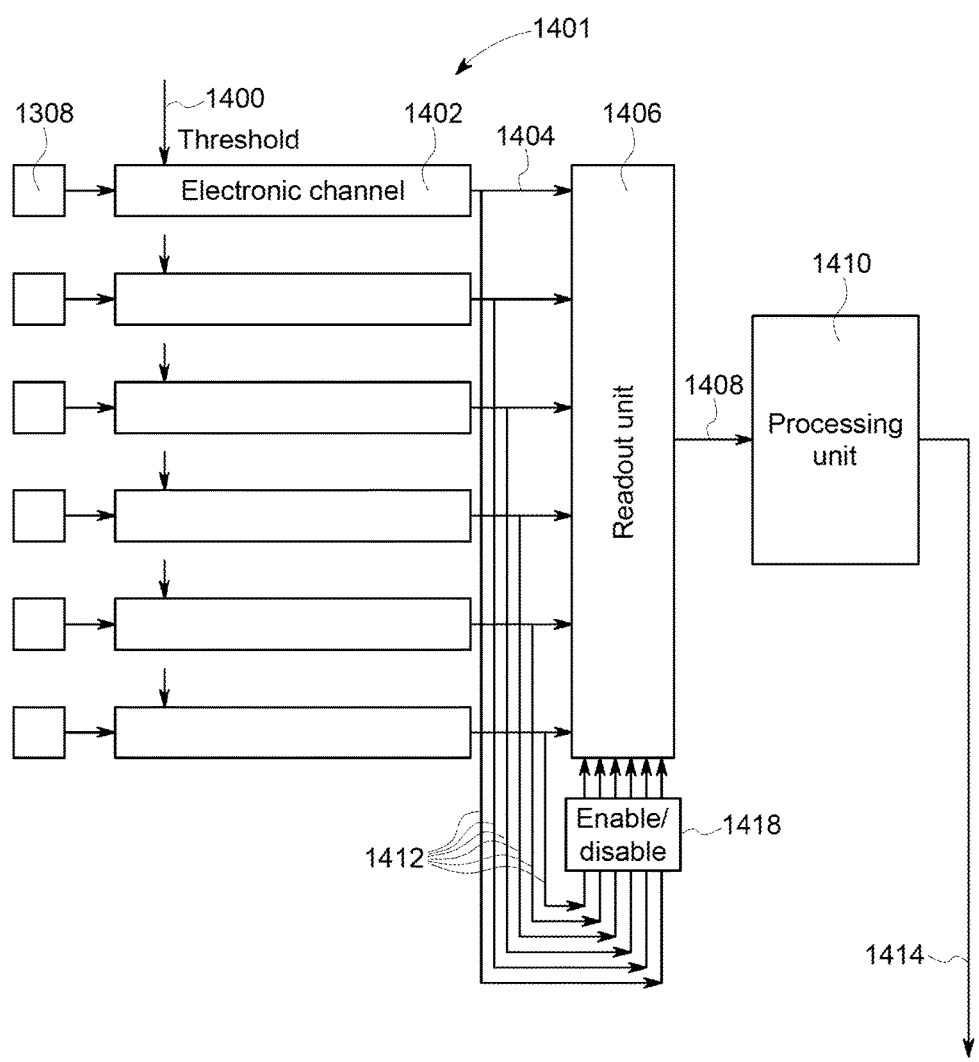
FIG. 14 illustrates a block diagram of processing components formed in accordance with various embodiments.

FIG. 14 provides a block schematic view of a processing system 1401. The processing system 1401 is configured to address charge-sharing as discussed herein. It may be noted that while processing unit 1410 is depicted as a separate block in the illustrated schematic view, the processing unit 1410 in various embodiments may include one or more physical blocks that incorporate various aspects of the processing system 1401.

As seen in FIG. 14, the processing system 1401 includes electronic channels 1402, terminals 1404, readout unit 1406, terminal 1408, processing unit 1410, terminals 1412, terminal 1414, and enable/disable unit 1418. As seen in FIG. 14, pixelated anodes 1308 are electrically connected to electronic channels 1402, which, for example, may be included on an ASIC. It may be noted that each electronic channel 1402 may includes a charge sensitive amplifier (CSA), shaper, comparator, amplifiers, and a peak & hold (P&H) (not shown). The comparator of the electronic channel 1402 may be controlled by input 1400 that controls the threshold level of the comparator to ensure that only signals above the threshold level will be transferred to the readout unit 1406 through terminals 1404.

In the illustrated embodiment, each electronic channel 1402 produces a trigger upon its signal passing the threshold level. The trigger is transferred to the readout unit 1406 via terminals 1412 and enable/disable unit 1418. When the readout unit 1406 receives such a trigger, it reads the signal from the electronic channels 1402 that are electrically connected to the particular pixelated anodes 1308 that are adjacent to the given pixelated anode 1308 that generated the trigger. The signals from those pixelated anodes are transferred, via terminal 1408 to the processing unit 1410, which sums the signals together to produce a signal based on the complete charge collection achieved by summing those signals (e.g., the signals from the trigger-generating anode and its adjacent anodes). The summed signal exits terminal 1414 with the address of the pixelated anode that first generated the trigger in the illustrated example.

Accordingly, all charges split between adjacent pixelated anodes 1308 are summed to recover a complete charge collection without the use of a sub-pixel map. In the case of no charge-sharing, the signals from adjacent pixels do not cross the appropriately set threshold and accordingly are not summed.

It may be noted that in the depicted example, after receiving the first triggering signal at the readout unit 1406, the enable/disable unit 1418 disables terminals 1412 for a predetermined amount of time to avoid additional triggering signals (e.g., triggering signals from adjacent pixelated anodes for the same shared event). After a time interval that allows the readout unit 1406 and the processing unit 1410 to read and sum all the signals arriving from the triggering pixelated anode 1308 and its adjacent anodes, the enable/disable unit 1418 returns to an enable state to allow a new trigger from another event to arrive to the readout unit 1406.

Accordingly, in various embodiments, the processing system 1401 (e.g., one or more processors forming the processing unit 1410 and/or other aspects of the processing system 1401) is configured to identify detected events from the pixelated anodes 1308. For example, the processing system 1401 (or aspects thereof) in various embodiments is configured to generate a trigger signal responsive to a given detected event (e.g., photon absorption) in a given pixelated anode 1308, provide the trigger signal to a readout (which may be a part of the processing unit 1410), and, using the readout, read and sum signals arriving from the given pixelated anode and anodes surrounding the given pixelated anode. For example, the processing unit 1410 may be configured to read and sum the signals for the given pixelated anode and pixelated anodes immediately adjacent to the given pixelated anode. Further, the processing system 1401 in various embodiments is configured to block trigger signals from other pixelated anodes for a predetermined time interval after receiving the trigger signal. It may further be noted that in various embodiments, the processing unit 1410 is configured to assign the given detected event to the pixelated anode from which the trigger signal originated. Once a sufficient or desired number of counts have been acquired or imaging time has been performed, the processing system 1401 may use the identified counts to reconstruct an image.

It may be noted that in various embodiments swiveling detectors may be placed in close vicinity to a patient body/organ to be imaged, and closely packed with each other. Since the swiveling detectors rotate, the circle defined by the swiveling detector should not touch the patient body or a circle defined by the adjacent swiveling detector. (See FIGS. 17 and 18). Accordingly, for a certain detector module, it is desirable to have the confining circle defined by the size of the detector module as small as possible to ensure that as many as possible swiveling detector modules can be placed around the patient body or organ to increase the detection sensitivity.

Figure 15:
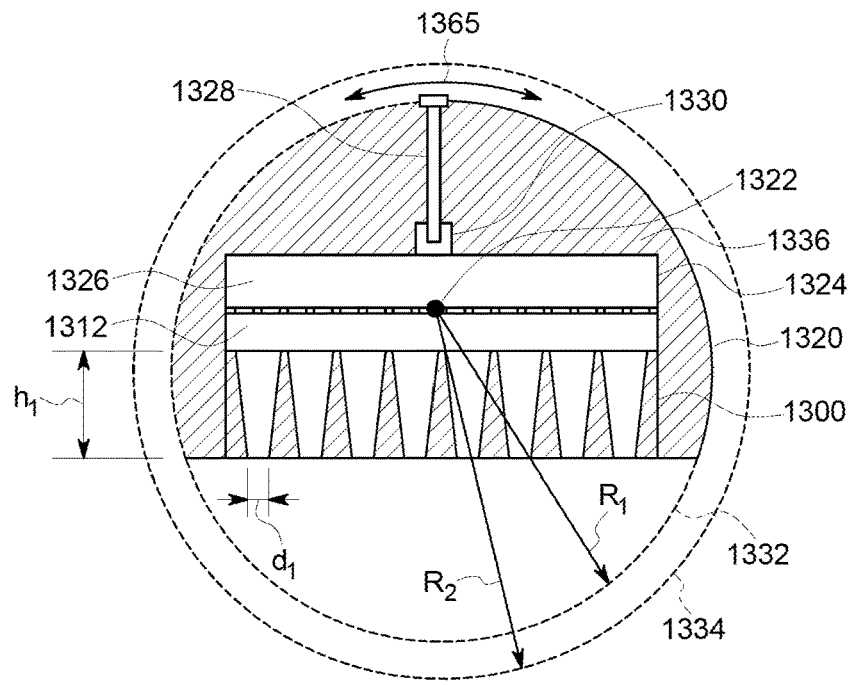
FIG. 15 schematically depicts a swiveling detector in accordance with various embodiments.
Figure 16:
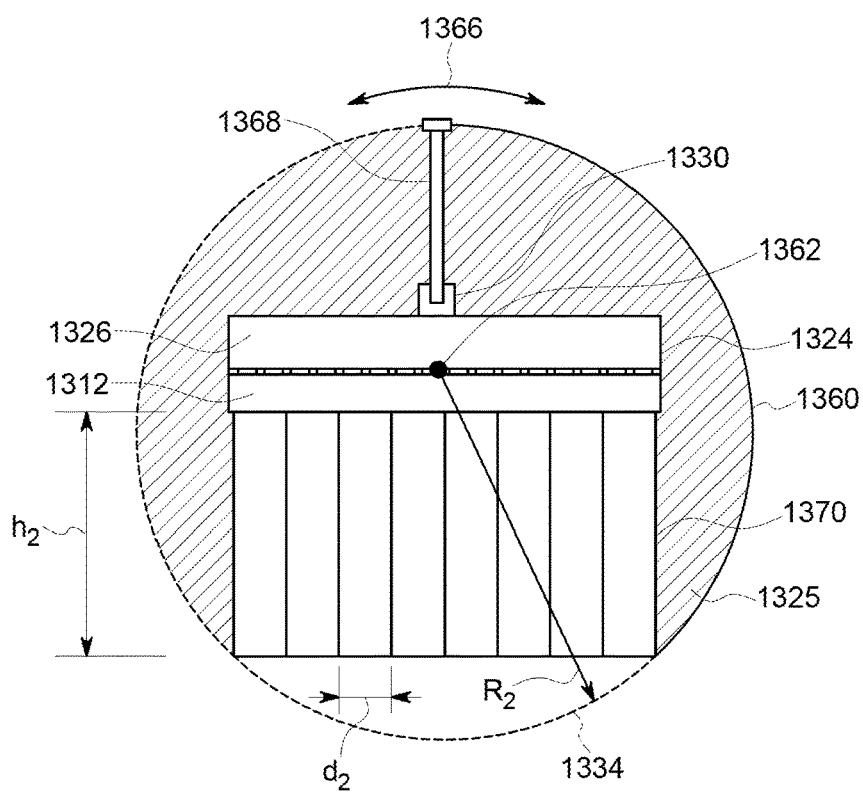
FIG. 16 schematically depicts a swiveling detector utilizing a conventional parallel-hole collimator.

One of the main factors that dictates the size of the confining circle of the detector module is the length of the collimator. FIGS. 15 and 16 illustrate the effect of the collimator size on overall size of detectors. The swiveling detectors of FIGS. 15 and 16 both contain the same general detector module 1324 thus, the same referral numbers are used in drawings 15 and 16 to indicate the same detector-module 1324 and its components. Accordingly, size differences between the detectors of FIGS. 15 and 16 are due to differences in collimator length.

FIG. 15 schematically shows a swiveling detector 1320 including a collimator 1300 according to various embodiments of the present disclosure (e.g., collimator 1300 discussed in connection with detector assembly 1390), and radiation detector module 1324, which includes detector 1312 and electronic unit 1326. The swiveling detector 1320 also contains radiation shielding material 1336 to which a cold finger 1330 of the detector module 1324 is attached by a screw 1328. The cold finger 1330 is used for heat dissipation and mounting of the detector module 1324. The swiveling detector 1320 rotates back and forth around its axis 1322 in the directions of arrows 1365. The swiveling detector 1320 is confined in circle 1332 having radius $R_1$.

FIG. 16 schematically shows a swiveling detector 1360 including a conventional parallel hole collimator 1370, and radiation detector module 1324, which includes detector 1312 and electronic unit 1326. The swiveling detector 1360 contains radiation shielding material 1325 to which a cold finger 1330 of detector module 1324 is attached by screw 1368. The swiveling detector 1360 rotates back and forth around its axis 1362 in the directions of arrows 1366. Swiveling detector 1360 is confined in circle 1334 having radius $R_2$.

It may be noted that swiveling detectors 1320 and 1360 both utilize the same detector module 1324. Accordingly, for the swiveling detectors 1320 and 1360 to have similar spatial-resolution and sensitivity, their collimators 1300 and 1370 should satisfy:

$$\frac{d_1}{h_1} \approx \frac{d_2}{h_2},$$

where $d_1$ and $h_1$ are the radiation receiving upper opening size and height of collimator 1300, and $d_2$ and $h_2$ are the opening size and height of the conventional parallel hole collimator 1370, respectively. Since $d_1 < d_2$ then $h_1 < h_2$ and thus $R_1 < R_2$ and, as shown in FIG. 15, the confining circle 1332 of the swiveling detector 1320 is smaller than the confining circle 1334 of the swiveling detector 1360.

Accordingly, the collimator 1300 not only allows the production of a collimator without radiation penetration and without sensitivity loss using 3D printing, but also enables the use of swiveling detectors that are more compact than may be accomplished with a parallel hole collimator while having the same spatial-resolution and sensitivity for the swiveling detectors.

Figure 17:
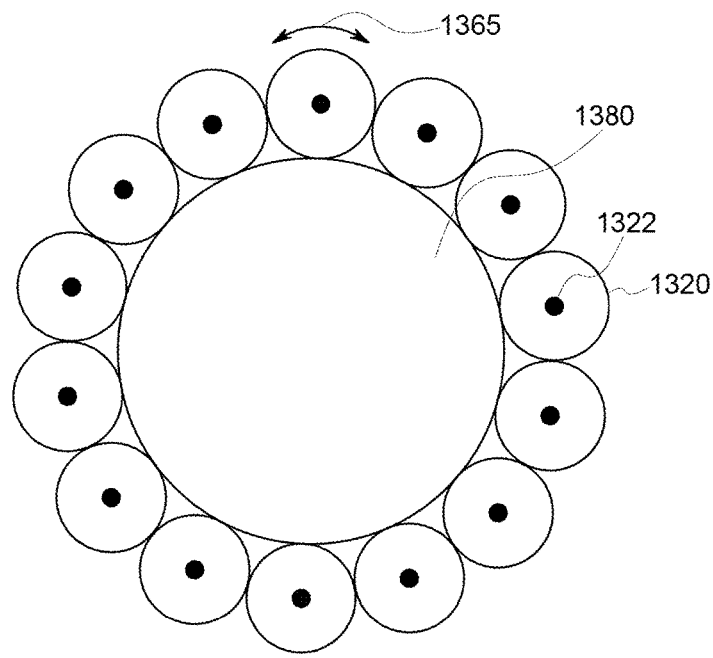
FIG. 17 schematically depicts a system including swiveling detectors detectors in accordance with various embodiments.
Figure 18:
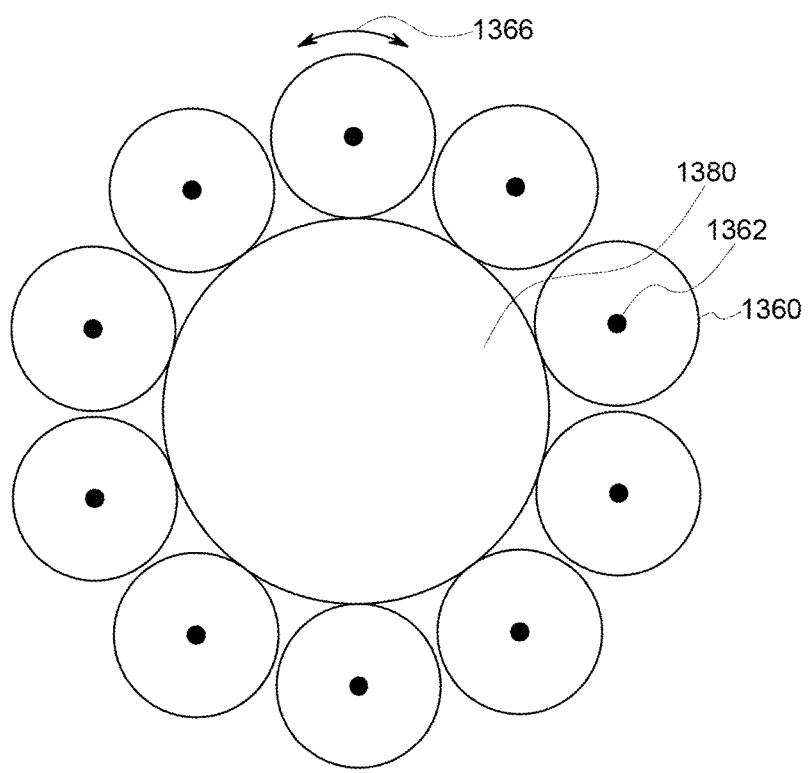
FIG. 18 schematically depicts a system including swiveling detectors.

It may be noted that the fact that collimator 1300 allows a swiveling detector 1320 having the same spatial-resolution and sensitivity as can be produced with conventional parallel hole collimator 1370 but, with a smaller radius $R_1$ of the confining circle 1332, provides the swiveling detector 1320 with collimator 1300 having various advantages as shown in FIGS. 17 and 18.

FIG. 17 schematically illustrates a system of swiveling detectors 1320 rotating back and forth around axis 1322 in the directions of arrows 1365. Detectors 1320 are arranged around patient body 1380. FIG. 18 schematically illustrates a system of swiveling detectors 1360 rotating back and forth around axis 1362 in the directions of arrows 1366. Detectors 1360 are arranged around the same patient body 1380 of FIG. 17. Since both swiveling detectors 1320 and 1360 have the same sensitivity and spatial-resolution, and, since the system of FIG. 17 includes more swiveling detectors 1320 around patient 1380 than the system of FIG. 18, the system of FIG. 17 according to various embodiments has a sensitivity that is significantly higher than the system of FIG. 18 that is based on a conventional parallel hole collimator.

Figure 19:
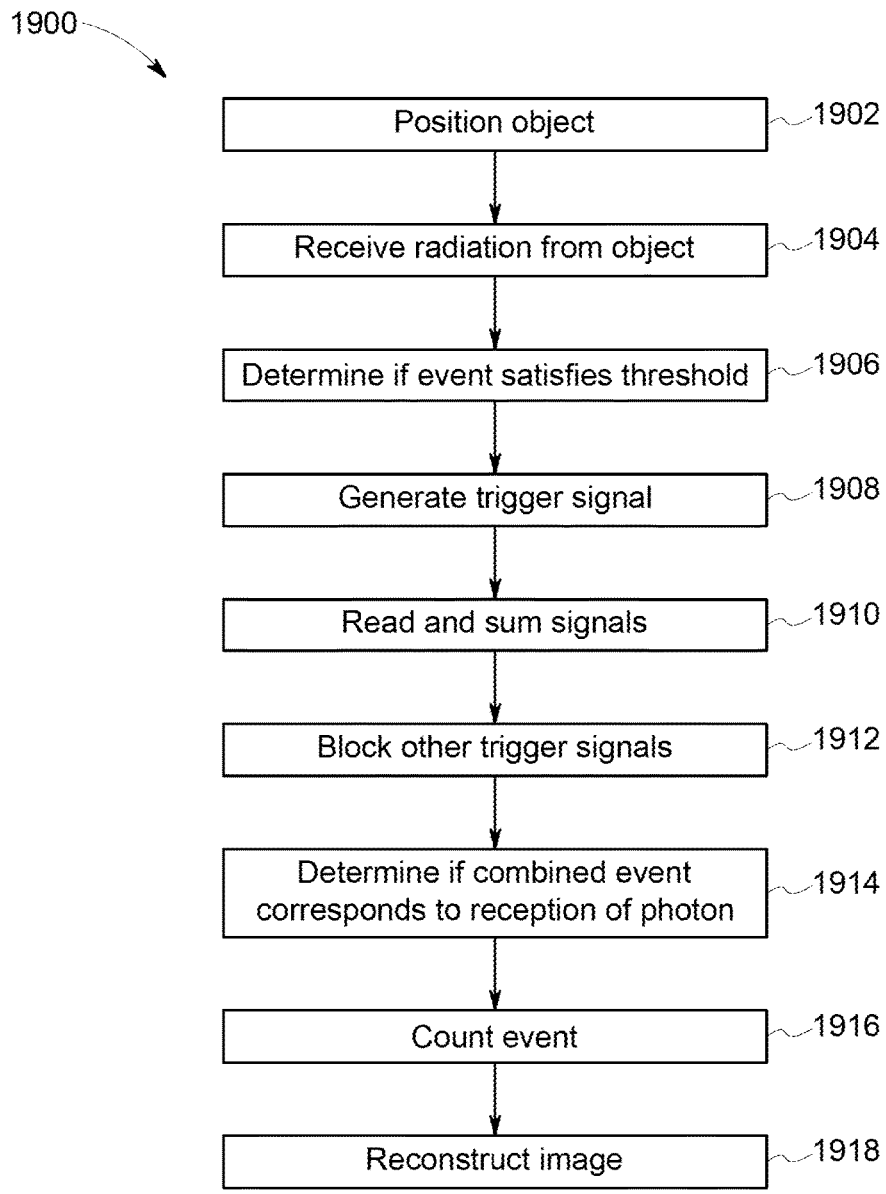
FIG. 19 provides a flowchart of a method in accordance with various embodiments.

FIG. 19 provides a flowchart of a method 1900 in accordance with an embodiment. The method 1900 may be carried out or performed using imaging systems and/or detector assemblies as set forth herein. It may be noted that the steps of method 1900 may represent programs or instructions configured to direct operations of one or more processors (e.g., processing system 1401 or aspects thereof). In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion.

At 1902, an object to be imaged is positioned. Generally, the object (e.g., a human patient or portion thereof) will have been administered a radiopharmaceutical resulting in the emission of radiation from the object. The object may be placed in a bore of a gantry containing multiple detectors, for example detectors that individually pivot or sweep to image the object.

At 1904, radiation from the object is received by one or more detectors of detectors of an imaging system (e.g., one or more detector assemblies 1390). Radiation received by each individual detector may be guided through a corresponding collimator (e.g., collimator 1300) for absorption by pixelated anodes 1308, with the pixelated anodes 1308 being arranged in groups, with each group corresponding to a single and only one opening of the collimator, to provide physical sub-pixellation.

At 1906, for a given detected event (e.g., a signal produced by a given pixelated anode of a detector), it is determined if the event satisfies a threshold. The threshold may be set to disregard signals that are too weak to form a significant part of a shared charge event. If the threshold is not satisfied, the event is disregarded and the system waits for the next detected event to be reported. If the event satisfies the threshold, the method 1900 proceeds to 1908.

At 1908, a trigger signal is generated responsive to the event detected at the given pixelated anode. At 1910, all signals from the pixelated anode that resulted in the trigger signal along with the pixelated anodes surrounding that anode (e.g., all anodes immediately adjacent to the triggering anode) are read and summed to provide a given combined event signal.

At 1912, trigger signals from other pixelated anodes than the one that resulted in the trigger signal at 1908 are blocked. For example, trigger signals from other anodes may be blocked for a predetermined time interval after receiving the triggering signal. Accordingly, for example, duplicate triggers from a shared event may be disregarded to avoid double-counting.

At 1914, it is determined if the combined event signal corresponds to reception of a photon. For example, the magnitude of the combined event signal may be compared to a known magnitude/energy of photons emitted due to the radiopharmaceutical. If the combined event signal is within a predetermined range of the known magnitude/energy for the photons, the combined event signal may be determined to be a true event, or to correspond to absorption of a photon.

At 1916, if the combined event signal corresponds to reception of a photon, the event is counted as a true event. The event may be assigned a location corresponding to the pixelated anode resulting in the original trigger, and may be assigned a Z location or DOI correspond to the absorption coefficient of the semiconductor used in the detector. At 1918, after acquisition of all imaging information, the accumulated counts are used to reconstruct an image.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid-state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A detector assembly including:
   a semiconductor detector having a first surface and a second surface opposed to each other, the first surface including pixelated anodes, and the second surface comprising a cathode electrode;
   a pinhole collimator including an array of pinhole openings corresponding to the pixelated anodes, wherein each pinhole opening corresponds to a corresponding group of pixelated anodes, wherein an area of each pinhole opening is smaller than a corresponding radiation receiving area of the corresponding group of pixelated anodes, and wherein the corresponding radiation receiving area of the corresponding group of pixelated anodes receives radiation from only one corresponding pinhole opening; and
   a processing unit operably coupled to the semiconductor detector and configured to identify detected events from the pixelated anodes, wherein the processing unit is configured to generate a trigger signal responsive to a given detected event in a given pixelated anode, provide the trigger signal to a readout, and, using the readout, read and sum signals arriving from the given pixelated anode and anodes surrounding the given pixelated anode to provide a combined event signal.

2. The detector assembly of claim 1, wherein the processing unit is configured to read and sum the signals for the given pixelated anode and pixelated anodes immediately adjacent to the given pixelated anode.

3. The detector assembly of claim 1, wherein the pin-hole openings are tapered, wherein the pin-hole openings are larger on a first surface proximate the semiconductor detector than on a second, opposed surface farther away from the semiconductor detector.

4. The detector assembly of claim 1, wherein each group of pixelated anodes corresponding to a given pinhole opening comprises N×M pixelated anodes, where N and M are integers greater than 1.

5. The detector assembly of claim 1, wherein the pinhole collimator is a 3D printed collimator.

6. The detector assembly of claim 1, wherein the processing unit is configured to count absorbed photons as events within a thickness of the semiconductor detector at a distance corresponding to $1/\mu$, where $\mu$ is the absorption coefficient of the semiconductor detector.

7. The detector assembly of claim 1, wherein the processing unit is configured to block trigger signals from other pixelated anodes for a predetermined time interval after receiving the trigger signal.

8. The detector assembly of claim 1, wherein the processing unit is configured to assign the given detected event to the pixelated anode from which the trigger signal originated.

9. A method comprising:
generating, with at least one processor, a trigger signal at a given pixelated anode of a semiconductor detector responsive to an event in the given pixelated anode, wherein the semiconductor has a first surface and second surface opposed to each other, the first surface including pixelated anodes including the given pixelated anode, the second surface comprising a cathode electrode, wherein radiation is passed to the semiconductor detector via a pinhole collimator including an array of pinhole openings corresponding to the pixelated anodes, wherein each pinhole opening corresponds to a corresponding group of pixelated anodes, where an area of each pinhole opening is smaller than a corresponding radiation receiving area of the corresponding group of pixelated anodes, and wherein the corresponding radiation receiving area of the corresponding group of pixelated anodes receives radiation from only one corresponding pinhole opening;
responsive to receiving the trigger signal, reading and summing all signals arriving from the given pixelated anode and anodes surrounding the given pixelated anode to provide a given combined event signal;
determining if the given combined event signal corresponds to reception of a photon; and,
if the given combined event signal corresponds to reception of a photon, counting the event in the given pixelated anode as a true event.

10. The method of claim 9, further comprising determining if the event in the given pixelated anode satisfies a threshold before generating the trigger signal.

11. The method of claim 9, wherein the signals that are read and summed are from the given pixelated anode and pixelated anodes immediately adjacent to the given pixelated anode.

12. The method of claim 9, further comprising blocking trigger signals from other pixelated anodes for a predetermined time interval after receiving the trigger signal.

13. The method of claim 9, further comprising assigning the true event to the pixelated anode from which the trigger signal originated.

14. The method of claim 9, further comprising counting absorbed photons as events within a thickness of the semiconductor detector at a distance corresponding to $1/\mu$, where $\mu$ is the absorption coefficient of the semiconductor detector.

15. A tangible and non-transitory computer readable medium comprising one or more computer software modules configured to direct one or more processors to:
generate, with at least one processor, a trigger signal at a given pixelated anode of a semiconductor detector responsive to an event in the given pixelated anode, wherein the semiconductor has a first surface and second surface opposed to each other, the first surface including pixelated anodes including the given pixelated anode, the second surface comprising a cathode electrode, wherein radiation is passed to the semiconductor detector via a pinhole collimator including an array of pinhole openings corresponding to the pixelated anodes, wherein each pinhole opening corresponds to a corresponding group of pixelated anodes, where an area of each pinhole opening is smaller than a corresponding radiation receiving area of the corresponding group of pixelated anodes, and wherein the corresponding radiation receiving area of the corresponding group of pixelated anodes receives radiation from only one corresponding pinhole opening;
responsive to receiving the trigger signal, read and sum all signals arriving from the given pixelated anode and anodes surrounding the given pixelated anode to provide a given combined event signal;
determine if the given combined event signal corresponds to reception of a photon; and,
if the given combined event signal corresponds to reception of a photon, count the event in the given pixelated anode as a true event.

16. The tangible and non-transitory computer readable medium of claim 15, wherein the one or more computer software modules are further configured to direct the one or more processors to determine if the event in the given pixelated anode satisfies a threshold before generating the trigger signal.

17. The tangible and non-transitory computer readable medium of claim 15, wherein the signals that are read and summed are from the given pixelated anode and pixelated anodes immediately adjacent to the given pixelated anode.

18. The tangible and non-transitory computer readable medium of claim 15, wherein the one or more computer software modules are further configured to direct the one or more processors to block trigger signals from other pixelated anodes for a predetermined time interval after receiving the trigger signal.

19. The tangible and non-transitory computer readable medium of claim 15, wherein the one or more computer software modules are further configured to direct the one or more processors to assign the true event to the pixelated anode from which the trigger signal originated.

20. The tangible and non-transitory computer readable medium of claim 15, wherein the one or more computer software modules are further configured to direct the one or more processors to count absorbed photons as events within a thickness of the semiconductor detector at a distance corresponding to $1/\mu$, where $\mu$ is the absorption coefficient of the semiconductor detector.

* * * * *